United States Patent
Onuki

(10) Patent No.: US 10,210,915 B2
(45) Date of Patent: Feb. 19, 2019

(54) MEMORY DEVICE AND SEMICONDUCTOR DEVICE INCLUDING THE SAME

(71) Applicant: Semiconductor Energy Laboratory Co., Ltd., Atsugi-shi, Kanagawa-ken (JP)

(72) Inventor: Tatsuya Onuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/613,508

(22) Filed: Jun. 5, 2017

(65) Prior Publication Data

US 2017/0358334 A1 Dec. 14, 2017

(30) Foreign Application Priority Data

Jun. 10, 2016 (JP) .................. 2016-116448

(51) Int. Cl.
*G11C 7/10* (2006.01)
*G11C 11/24* (2006.01)
(Continued)

(52) U.S. Cl.
CPC ............ *G11C 7/1018* (2013.01); *G11C 5/025* (2013.01); *G11C 11/24* (2013.01);
(Continued)

(58) Field of Classification Search
CPC ....... G11C 7/1018; G11C 5/025; G11C 11/24; G11C 11/4023; G11C 11/4091; G11C 11/4097
See application file for complete search history.

(56) References Cited

U.S. PATENT DOCUMENTS 7,272,070 B2 *  9/2007  Hummler ............. G11C 7/1018
                                                         365/230.03
8,508,967 B2     8/2013  Yamazaki et al.
(Continued)

FOREIGN PATENT DOCUMENTS

JP   2012-256820 A   12/2012
JP   2016-054282 A    4/2016
(Continued)

OTHER PUBLICATIONS

Onuki.T et al., "DRAM with Storage Capacitance of 3.9 fF using CAAC-OS Transistor with L of 60 nm and having More Than 1-h Retention Characteristics", SSDM 2014 (Extended Abstracts of the 2014 International Conference on Solid State Devices and Materials), Sep. 8, 2014, pp. 430-431.

*Primary Examiner* — Tri Hoang
(74) *Attorney, Agent, or Firm* — Robinson Intellectual Property Law Office; Eric J. Robinson

(57) ABSTRACT

A memory device with reduced latency is provided. The memory device includes a burst read mode with a burst length of $M_0$ ($M_0$ is an integer greater than or equal to 2), a global sense amplifier array, $M_0$ local memory cell arrays <1> to <$M_0$>, and $M_0$ local sense amplifier arrays <1> to <$M_0$>. A memory cell includes a transistor and a capacitor. A local memory cell array <J> (J is an integer from 1 to $M_0$) is stacked over a local sense amplifier array <J>. The local memory cell array <J> comprises $M_0$ blocks <J_1> to <J_$M_0$> differentiated by row, The local sense amplifier array <J> in an idle state retains the data of the block <J_J>. The block <J_J> is specified when the local memory cell array <J> is the first local memory cell array to be accessed in a burst read mode.

15 Claims, 12 Drawing Sheets

(51) Int. Cl.
  *G11C 11/402* (2006.01)
  *G11C 5/02* (2006.01)
  *G11C 11/4091* (2006.01)
  *G11C 11/4097* (2006.01)
(52) U.S. Cl.
  CPC ...... *G11C 11/4023* (2013.01); *G11C 11/4091* (2013.01); *G11C 11/4097* (2013.01)

(56) References Cited

U.S. PATENT DOCUMENTS

| | | | |
|---|---|---|---|
| 8,638,621 B2* | 1/2014 | Son | G11C 11/4091 365/190 |
| 9,001,607 B2* | 4/2015 | Ong | G11C 7/222 365/219 |
| 9,478,276 B2 | 10/2016 | Onuki | |
| 2004/0232497 A1 | 11/2004 | Akiyama et al. | |
| 2015/0294710 A1* | 10/2015 | Onuki | G11C 7/1069 365/149 |
| 2016/0104521 A1* | 4/2016 | Onuki | G11C 11/4091 365/72 |
| 2017/0337149 A1 | 11/2017 | Onuki et al. | |

FOREIGN PATENT DOCUMENTS

| WO | WO-2016/181256 | 11/2016 |
|---|---|---|
| WO | WO 2017/158465 | 9/2017 |

* cited by examiner

FIG. 6

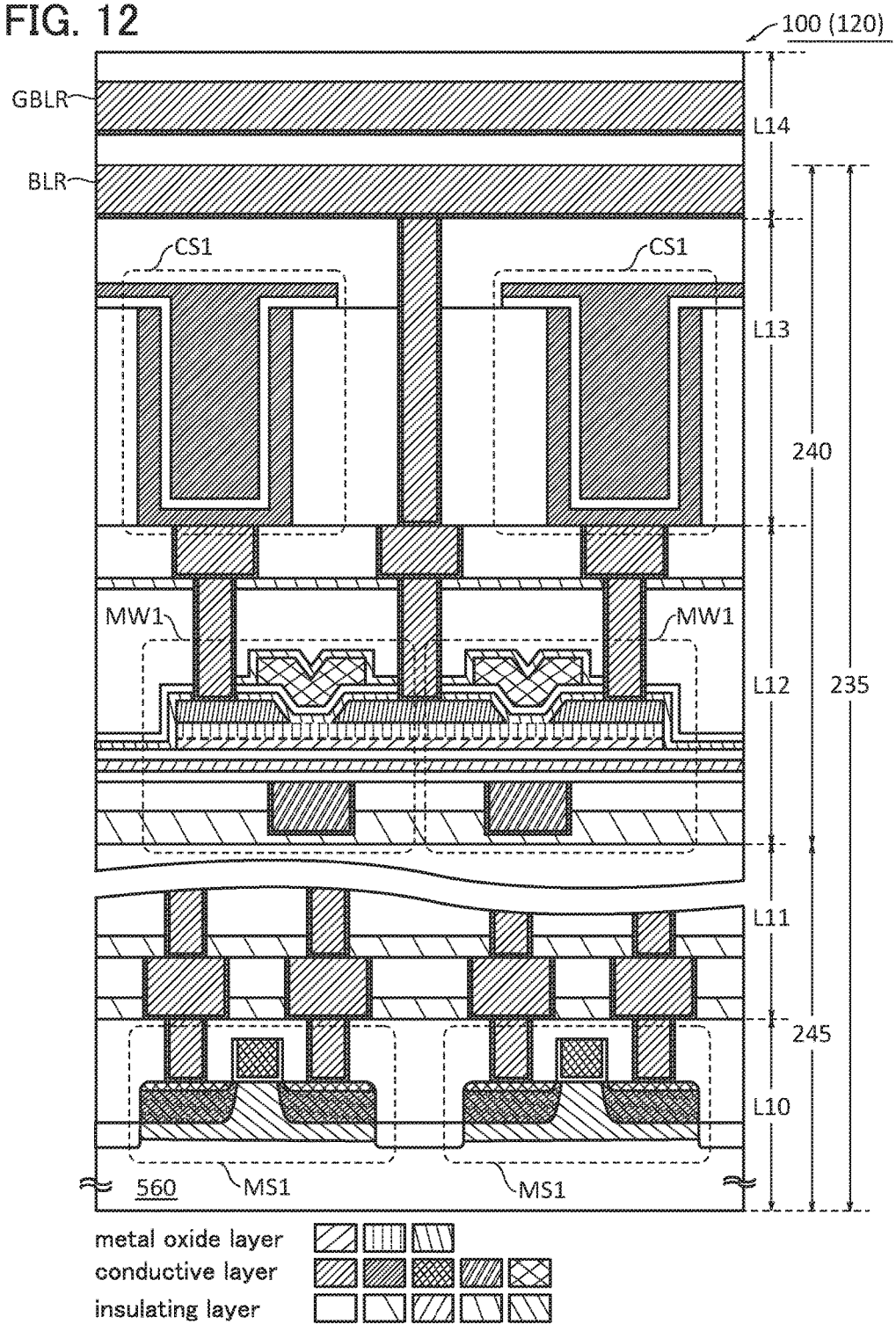

MEMORY DEVICE AND SEMICONDUCTOR DEVICE INCLUDING THE SAME

BACKGROUND OF THE INVENTION

1. Field of the Invention

One embodiment of the present invention disclosed in the specification, the drawings, and the claims (hereinafter referred to as this specification and the like) relates to a semiconductor device, a driving method thereof, a usage method thereof, a manufacturing method thereof, or the like. Note that one embodiment of the present invention is not limited to the exemplified technical field.

2. Description of the Related Art

Dynamic random-access memory (DRAM) is widely used as one of the typical memory technologies. A typical DRAM cell consists of one transistor (1T) and one capacitor (1C). DRAM is a memory device in which data are stored by accumulating a charge in the capacitor, and thus has an unlimited write endurance in principle. DRAM is embedded in many electronic devices as a high-capacity memory device, because of its fast reads and writes and because of its capability for high integration, owing to the small number of elements within a DRAM cell.

A transistor including a metal oxide in a channel formation region (hereinafter, such a transistor may be referred to as a metal oxide transistor, an oxide semiconductor transistor, or an OS transistor) is known. A 1T1C-type DRAM whose cell is composed of an OS transistor is proposed (e.g., Patent Documents 1 and 2, and Non-patent Document 1)

In this specification and the like, a memory device whose memory cell is provided with an OS transistor is termed an OS memory, an oxide semiconductor memory, or a metal oxide memory. Of the OS memory devices, a DRAM with 1T1C-type memory cells are referred to as an oxide semiconductor DRAM, or a DOSRAM (registered trademark). DOSRAM stands for dynamic oxide semiconductor random access memory.

REFERENCE

[Patent Document 1] Japanese Published Patent Application No. 2012-256820
[Patent Document 2] Japanese Published Patent Application No. 2016-54282
T. Onuki, et al., "DRAM with Storage Capacitance of 3.9 fF Using CAAC-OS Transistor with L of 60 nm and Having More Than 1-h Retention Characteristics," Ext. Abstr. SSDM, 2014, pp. 430-431.

SUMMARY OF THE INVENTION

An object of one embodiment of the present invention is to provide a novel memory device, an operation method thereof, or a usage method thereof. Furthermore, an object of one embodiment of the present invention is to enable pipeline operation, to reduce latency, to improve performance, or to reduce power consumption, for example.

Note that one embodiment of the present invention does not necessarily achieve all the objects. The descriptions of a plurality of objects do not preclude their coexistence. Other objects will be apparent from the description of this specification and the like, and such objects could be objects of one embodiment of the present invention.

(1) One embodiment of the present invention is a memory device configured with a burst read mode with a burst length of $M_0$ ($M_0$ is an integer greater than or equal to 2). The memory device includes a global sense amplifier array, $M_0$ local memory cell arrays <1> to <$M_0$>, and $M_0$ local sense amplifier arrays <1> to <$M_0$>. A local memory cell array <J> (J is an integer from 1 to $M_0$) is stacked over a local sense amplifier array <J>. The local memory cell array <J> includes $M_0$ blocks <J_1> to <J_$M_0$> in each row. The blocks <J_1> to <J_$M_0$> each include a plurality of memory cells. The memory cell includes a capacitor and a transistor controlling charging and discharging of the capacitor. The local sense amplifier array <J> in an idle state retains the data of the block <J_J>. The block <J_J> is specified when the local memory cell array <J> is the first local memory cell array to be accessed in burst read mode.

(2) In Embodiment (1), one block in each of the local memory cell arrays <1> to <$M_1$> are to be accessed during the burst read mode.

(3) In Embodiment (1), blocks <1_$J_x$> to <$M_0$_$J_x$> ($J_x$ is an integer from 1 to $M_0$) are to be accessed during the burst read mode when a local array <$J_x$> is specified by an external address signal ADDR.

(4) One embodiment of the present invention is a memory device configured with a burst read mode with a burst length of $M_0 \times M_1$ ($M_0$ is an integer greater than or equal to 2, and $M_1$ is an integer greater than or equal to 1). The memory device includes a controller, a row circuit, a global sense amplifier array, and $M_0 \times M_1$ local arrays <1> to <$M_0 M_1$>. The J×Kth (J is an integer from 1 to $M_0$, and K is an integer from 1 to $M_0$) local array <JK> includes a local memory cell array <JK> and a local sense amplifier array <JK>. The local memory cell array <JK> is stacked over the local sense amplifier array <JK>. The local memory cell array <JK> includes $M_0$ blocks <JK_1> to <JK_$M_0$> that are grouped by row. The blocks <JK_1> to <J_$M_0$> each include a plurality of memory cells. The memory cell includes a capacitor and a transistor that controls the charging and discharging of the capacitor. The row circuit has a function of driving the local arrays <1> to <$M_0 M_1$>. The controller has a function of controlling the row circuit and the global sense amplifier array. The controller has a function of generating $M_0 M_1$ address signals ADDRi_1 to ADDRi_$M_0 M_1$ from an external address signal ADDR during the burst read mode. The address signals ADDRi_1 to ADDRi_$M_0 M_1$ each have different local array addresses and the same row address. The row address is determined based on the local array address of the external address signal ADDR.

(5) In Embodiment (4), when the local array address of the external address signal ADDR is an address of a local array <$jM_0+X_1$> (j is an integer from 0 to $M_1-1$, and $X_0$ is an integer from 1 to $M_0$), the address signal ADDRi_1 is an address signal that specifies a block <$jM_0+X_{1-x1}$>.

(6) In Embodiments (4) and (5), the controller has a control function of electrically connecting the local sense amplifier array <$J_1 K_1$> and the global sense amplifier array in the local array <$J_1 K_1$> ($J_1$ is an integer from 1 to $M_0$, and $K_1$ is an integer from 1 to $M_1$) specified by the address signal ADDR_1, and then reading out data in the local memory cell array to the local sense amplifier in each of the other ($M_0 M_1 - 1$) local array, when the address signal ADDRi_1 is set.

(7) In at least one of the Embodiments (4) to (6), the controller has a control function of electrically connecting a local sense amplifier array <$J_x$> in the local array <$J_y$>, which is specified by an address signal ADDRi_Y (Y is an integer from 2 to $M_0 M_1$), and a global sense amplifier array <$J_X$>. The controller also has a control function of reading out data in the block <$J_Y X_1$> to the local sense amplifier array <$J_X$> during a clock cycle in which a connection relation of a local sense amplifier array <$J_X$> and the global sense amplifier array changes from being electrically connected to being electrically disconnected. $X_1$ is an integer from 1 to $M_0$, j is an integer from 0 to $M_1-1$, and $J_Y$ is $jM_0+X_1$.

(8) In at least one of the Embodiments (1) to (7), the channel formation region of the transistor in the memory cell includes a metal oxide semiconductor.

(9) One embodiment of the present invention is a semiconductor device that includes a processor core, a bus, and a memory device in any one of the Embodiments (1) to (8).

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit and a chip including an integrated circuit are semiconductor devices. Moreover, a storage device, a display device, a light-emitting device, a lighting device, an imaging device, an electronic device, and the like include a semiconductor device in some cases, or are semiconductor device themselves in some cases.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts. Here, X and Y denote an object (e.g., a device, an element, a circuit, a wiring, an electrode, a terminal, a conductive film, a layer, or the like).

A transistor includes three terminals: a gate, a source, and a drain. A gate functions as a control terminal that controls the conduction state of a transistor. Functions of input/output terminals of the transistor depend on the type and the levels of potentials applied to the terminals, and one of the two terminals serves as a source and the other serves as a drain. Therefore, the terms "source" and "drain" can be used interchangeably in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential or a source potential). Thus, a voltage can also be referred to as a potential. Note that the potential indicates a relative value. Accordingly, "ground potential" does not necessarily mean 0 V.

In this specification and the like, the terms "film" and "layer" can be interchanged depending on the case or circumstances. For example, a term "conductive layer" can be changed to a term "conductive film" in some cases. For example, a term "insulating film" can be changed to a term "insulating layer" in some cases.

In this specification and the like, ordinal numbers such as first, second, and third are used to avoid confusion among components, and the terms do not limit the components numerically or do not limit the order.

One embodiment of the present invention can provide a novel memory device, an operation method thereof, or a usage method thereof.

In addition, one embodiment of the present invention can enable pipeline operation, reduce latency, improve performance, and reduce power consumption, for example.

One embodiment of the present invention does not necessarily achieve all the exemplified objects. The descriptions of a plurality of effects do not preclude the existence of other effects. In one embodiment of the present invention, an object other than the above objects, an effect other than the above effects, and a novel feature will be apparent from the description of the specification and the drawings.

BRIEF DESCRIPTION OF THE DRAWINGS

FIG. 6 illustrates an operation example of a burst read operation in DOSRAM.

FIG. 12 is a cross-sectional view illustrating a structure example of an MCU.

DETAILED DESCRIPTION OF THE INVENTION

Figure 1:
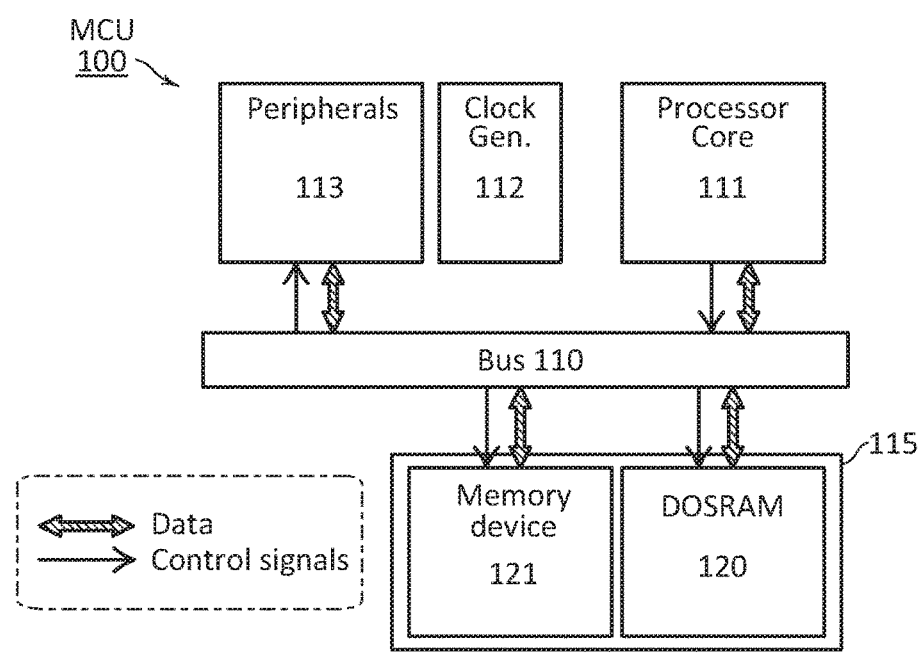
FIG. 1 is a block diagram illustrating a configuration example of a microcontroller unit (MCU).

An embodiment of the present invention will hereinafter be described. Note that any of the embodiments described in this specification can be combined as appropriate. In addition, in the case where a plurality of configuration examples and/or structure examples (including operation examples, usage examples, manufacturing method examples, and the like) are given in one embodiment, any of the structure examples can be combined as appropriate. Furthermore, the present invention can be implemented in various different modes, and it is easily understood by those skilled in the art that modes and details of the present invention can be changed in various ways without departing from the spirit and scope of the present invention. Thus, the present invention should not be interpreted as being limited to the following description of the embodiments.

In the drawings, the size, the layer thickness, the region, or the like is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below", are used for convenience in describing a positional relationship between components with reference to drawings in some cases. Furthermore, the positional relationship between components is changed as appropriate depending on the direction in which each component is described. Thus, there is no limitation on terms used in this specification, and description can be made appropriately depending on the situation.

The positional relationships of circuit blocks illustrated in a block diagram are specified for description; therefore, the positions of circuit blocks of one embodiment of the present invention are not limited thereto. Even when a block diagram illustrates that different functions are achieved by different circuit blocks, one circuit block may be actually configured to achieve different functions. Functions of circuit blocks in a diagram are specified for description, and even when a diagram shows one circuit block performing given processing, a plurality of circuit blocks may actually be provided to perform the processing.

Embodiment 1

In this embodiment, a semiconductor device including an OS memory is described.

<<MCU>>

FIG. 1 illustrates a configuration example of a microcontroller unit (MCU). An MCU 100 illustrated in FIG. 1 includes a bus 110, a processor core 111 (hereinafter referred to as a core 111), a clock generation circuit 112, a peripherals 113, and a memory portion 115. The memory portion 115 includes a DOSRAM 120 and a memory device 121. MCU 100 is a semiconductor device that is fabricated as one chip.

The clock generation circuit 112 has a function of generating a clock signal that is used in the MCU 100. There are no particular functional limitations on the peripherals 113. Various functional circuits are provided in the peripherals 113, depending on how the MCU 100 is to be used. Examples of the functional circuits include a power supply circuit, a power management unit, a timer device, an interrupt controller, an input/output port, an analog-digital converter (ADC), a comparator, and an operational amplifier. When MCU 100 is to be used as a controller for a display device (also referred to as a display controller), the peripherals 113 may be provided with circuits such as an image processing circuit that processes image data, and a timing controller that generates a timing signal. In this case, the DOSRAM 120 of the memory portion 115 may be used as a frame memory.

The memory portion 115 includes a DOSRAM 120 and a memory device 121. The memory device 121 can be any memory device as long as it can be rewritten; examples of such a memory device include an SRAM, a flash memory, a ferroelectric RAM (FeRAM), a magnetoresistive RAM (MRAM), a resistive RAM (ReRAM), and a phase-change RAM (PRAM).

The memory portion 115 does not necessarily include the memory device 121. Alternatively, the memory portion 115 may include a plurality of memory devices 121; the memory devices 121 included in the memory portion 115 may be SRAM and flash memory, for example. In addition, the memory portion 115 may include a read-only memory (ROM).

The core 111 exchanges data with the memory portion 115 and the peripherals 113 through the bus 110. A control signal from the core 111 is input to the bus 110. The bus 110 sends the control signal to a circuit block that is to be controlled. Examples of control signals include an enable signal and an address signal.

<DOSRAM 120>

Figure 2A:
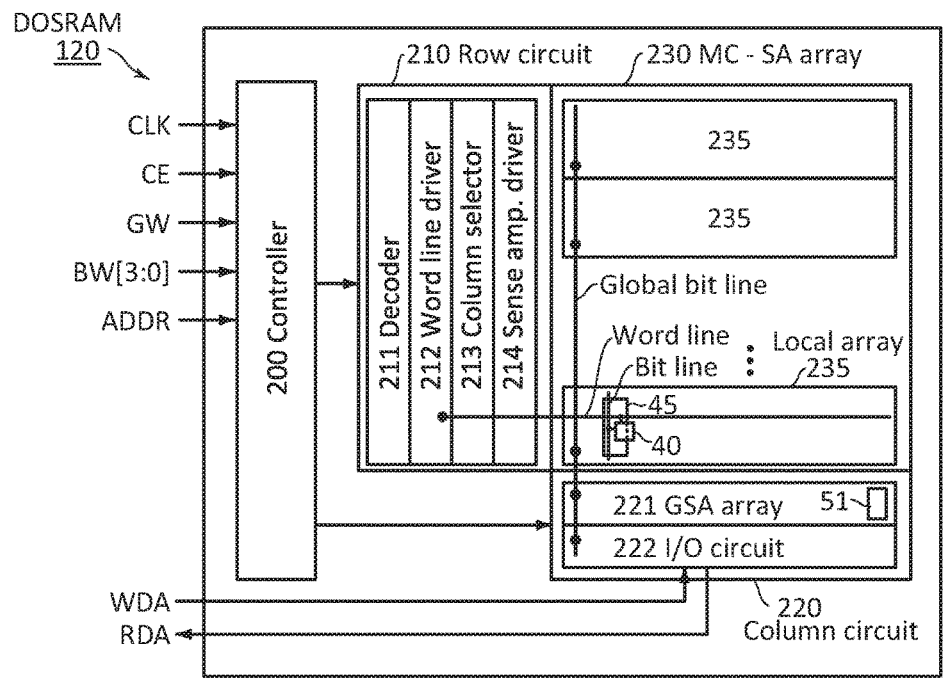
FIG. 2A is a block diagram illustrating a configuration example of DOSRAM.

FIG. 2A is a block diagram illustrating a configuration example of the DOSRAM 120. The DOSRAM 120 includes a controller 200, a row circuit 210, a column circuit 220, and a memory cell and sense amplifier array 230 (hereinafter referred to as the MC-SA array 230). The row circuit 210 includes a decoder 211, a word line driver 212, a column selector 213, and a sense amplifier driver 214. The column circuit 220 includes a global sense amplifier (GSA) array 221, and an input/output (I/O) circuit 222. The MC-SA array 230 includes a plurality of local arrays 235 and a plurality of global bit lines. The local array 235 includes a plurality of memory cells 40, a plurality of sense amplifiers 45, a plurality of bit lines, and a plurality of word lines.

Signals CLK, CE, GW, BW[3:0], ADDR, and a data signal WDA are input signals of the DOSRAM 120, and a data signal RDA is an output signal of the DOSRAM 120. The signal CLK is a clock signal. The signals CE, GW, BW[3:0], and ADDR are a chip enable signal, a write enable signal, byte write enable signals, and address signals, respectively. The data signal WDA is a write data signal, and the data signal RDA is a read data signal. In the following description, the bit length of a data signal is 1 word, and 1 word is composed of 32 bits.

In the DOSRAM 120, each circuit, signal and potential can be provided or omitted as appropriate. It is also possible to add another circuit or another signal. In addition, the structure of the input signal and the output signal (e.g., bit length) of the DOSRAM 120 is determined based on the operation method of the DOSRAM 120, the configuration of the MC-SA array 230, or the like.

(MC-SA Array 230)

Figure 2B:
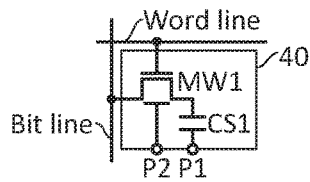
FIGS. 2B to 2D are circuit diagrams illustrating a configuration example of a memory cell.

FIG. 2B illustrates the circuit configuration example of the memory cell 40. The memory cell 40 includes a transistor MW1, a capacitor CS1, and terminals P1 and P2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to a terminal P1. A constant potential (e.g., low supply potential) is input to the terminal P1.

The transistor MW1 includes a back gate, and the back gate is electrically connected to the terminal P2. This makes it possible to change the threshold voltage of the transistor MW1 with a potential applied to a terminal P2. For example, a fixed potential (e.g., negative constant potential) may be applied to the terminal P2; alternatively, the potential applied to the terminal P2 may be changed in response to the operation of the DOSRAM 120.

The transistor MW1 is an OS transistor. The off-state current of the OS transistor is extremely low, making the OS transistor suitable for a transistor in a DOSRAM memory cell. The extremely low off-state current of the transistor MW1 can inhibit leakage of charge from the capacitor CS1. Therefore, the retention time of the DOSRAM 120 is considerably longer than that of DRAM. This allows less frequent refresh, which can reduce power needed for refresh operations. In addition, the DOSRAM 120 has no limitations on the number of rewrites in principle and can read and write data with low energy consumption, because data are rewritten by charging and discharging the capacitor CS1.

Here, the term "off-state current" refers to current that flows between the source and the drain when the transistor is in an off state. For an n-channel transistor, for example, when the threshold voltage of the transistor is approximately 0 V to 2 V, a current that flows between a source and a drain when a voltage between a gate and the source is negative can be referred to as an off-state current. In addition, the expression "extremely low off-state current" refers to, for example, an off-state current of less than or equal to 100 zA (z represents zepto and denotes a factor of $10^{-21}$) per channel width of 1 µm. Since a lower off-state current is preferable, this normalized off-state current is preferably less than or equal to 10 zA/µm or less than or equal to 1 zA/µm, and further preferably lower than or equal to 10 yA/µm (y represents yocto and denotes a factor of $10^{-24}$).

Because a bandgap of a metal oxide is greater than or equal to 2.5 eV or greater than equal to 3.0 eV, leakage current of the OS transistor due to thermal excitation is low, and as described above, its off-state current is extremely low. The off-state current of the OS transistor normalized by channel width can be reduced to a range of approximately a few yA per µm to a few zA per µm. Examples of metal oxides that can be used in the channel formation region of an OS transistor include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn or Hf). In addition, an oxide containing indium and zinc may contain one or more chosen from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, and magnesium.

The OS transistor preferably includes a cloud-aligned composite oxide semiconductor (CAC-OS) in a channel formation region. The OS transistor including a CAC-OS has high on-state current and is highly reliable. Note that the details of the CAC-OS will be described later in Embodiment 4.

Figure 2C:
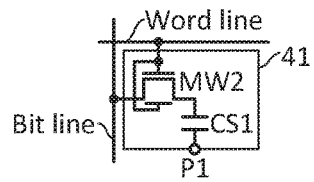
Figure 2D:
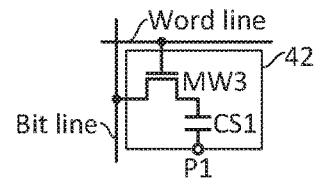

FIGS. 2C and 2D each illustrate a modification example of the memory cell 40. In a memory cell 41 illustrated in FIG. 2C, a transistor MW2 including a back gate and a gate that are electrically connected to each other is provided instead of the transistor MW1. In the memory cell 41, the back gate of the transistor MW2 may be electrically connected to a source or a drain of the transistor MW2. In a memory cell 42 illustrated in FIG. 2D, a transistor MW3 that does not include a back gate is provided instead of the transistor MW1. Both the transistors MW2 and MW3 are OS transistors.

Figure 2E:
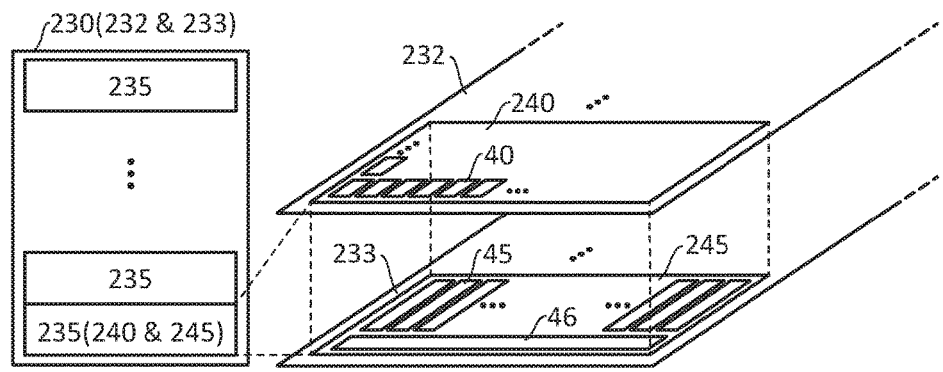
FIG. 2E is a block diagram illustrating a configuration example of DOSRAM.

FIG. 2E illustrates a configuration example of the MC-SA array 230. The DOSRAM 120 adopts a hierarchical bit line structure, where the bit lines are layered into local and global bit lines. This allows the MC-SA array 230 to be divided into a plurality of local arrays 235. In addition, the memory cell 40 can be stacked over the sense amplifier 45 when the transistor of the memory cell 40 is the OS transistor. Thus, the MC-SA array 230 has a stacked structure where a memory cell array 232 is stacked over a sense amplifier array 233. The global bit line is stacked over the memory cell array 232.

The memory cell array 232 is divided into a plurality of subarrays. Here, the subarray is referred to as a local memory cell array 240. The sense amplifier array 233 is also composed of a plurality of subarrays; here, the subarray is referred to as a local sense amplifier array 245. The local array 235 has a stacked structure where the local memory cell array 240 is stacked over the local sense amplifier array 245.

The local memory cell array 240 is provided with a plurality of memory cells 40, a plurality of word lines, and a plurality of bit lines.

The local sense amplifier array 245 is provided with a plurality of sense amplifiers 45 and a switch array 46. A bit line pair is electrically connected to the sense amplifier 45. The sense amplifier 45 has a function of precharging the bit line pair, a function of amplifying a potential difference between the bit line pair, and a function of retaining the potential difference. The switch array 46 has a function of controlling conduction between the bit line pair and a global bit line pair.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines.

(Controller 200)

The controller 200 has a function of controlling the overall operation of the DOSRAM 120. The controller 200 has a function of performing logic operations on the signals CE, GW, and BW[3:0] and determining the operation mode, a function of generating control signals for the row circuit 210 and the column circuit 220 so as to execute the determined operation mode, and a function of generating an internal address signal from the signal ADDR.

(Row Circuit 210)

The row circuit 210 has a function of driving the MC-SA array 230. For example, the row circuit 210 has a function of selecting the memory cell 40 that is to be accessed, a function of driving the sense amplifier array 233, a function of controlling the input and output of data signals between the memory cell array 232 and the sense amplifier array 233, and a function of controlling the input and output of data signals between the sense amplifier array 233 and the global sense amplifier array 221.

The decoder 211 has a function of decoding the signal ADDR. The word line driver 212, the column selector 213, and the sense amplifier driver 214 each generate signals based on the signals generated by the controller 200 and the decoder 211.

The word line driver 212 generates a selection signal that selects the word line on a row that is to be accessed.

The column selector 213 and the sense amplifier driver 214 are circuits for driving the sense amplifier array 233. The column selector 213 has a function of generating a selection signal for selecting the bit line on the column to be accessed. The selection signal from the column selector 213 controls the switch array 46 on each of the local sense amplifier arrays 245. The control signal from the sense amplifier driver 214 drives each of a plurality of local sense amplifier arrays 245 independently.

(Column Circuit 220)

The column circuit 220 has a function of controlling the input of data signal WDA, and a function of controlling the output of the data signal RDA.

The global sense amplifier array 221 includes a plurality of global sense amplifiers 51. The global sense amplifier 51 is electrically connected to the global bit line pair. The global sense amplifier 51 has a function of amplifying a potential difference between the global bit line pair, and a function of retaining the potential difference. Data are written to and read from the global bit line pair by the I/O circuit 222.

Due to the fact that the MC-SA array 230 has a stacked structure, the bit line can be shortened to a length that is close to the length of the local sense amplifier array 245. A shorter bit line result in lower bit line capacitance, which allows the storage capacitance of the memory cell 40 to be reduced. In addition, providing the switch array 46 on the local sense amplifier array 245 allows the number of long bit lines to be reduced. From the reasons described above, a load to be driven during access to the DOSRAM 120 is reduced, enabling a reduction in the power consumption of the MCU 100.

A write operation of the DOSRAM 120 is briefly described. Data are written to the global bit line pair by the I/O circuit 222. The data of the global bit line pair are retained by the global sense amplifier array 221. In the local array 235 specified by the signal ADDR, the switch array 46 writes the data of the global bit line pair to the bit line pair on the column where data are to be written. The local sense amplifier array 245 amplifies the written data, and then retains the amplified data. When a word line WL on the row of the specified address is selected, the data retained at the local sense amplifier array 245 are written to the memory cell 40 on the selected row.

A read operation of the DOSRAM 120 is briefly introduced. One row of one local array 235 is specified with the signal ADDR. In the specified local array 235, the word line WL that is to be read is selected, and data of the memory cell 40 are written to the bit line. The local sense amplifier array 245 detects a potential difference in the bit line pair in each column as data, and retains the data. The switch array 46 writes the data of a column of the specified address to the global bit line pair; the data are chosen from the data retained at the local sense amplifier array 245. The global sense amplifier array 221 detects and retains the data of the global bit line pair. The data retained at the global sense amplifier array 221 are output to the I/O circuit 222, completing the read operation.

The DOSRAM 120 has no limitations on the number of rewrites in principle and data can be read and written with low energy consumption, because data are rewritten by charging and discharging the capacitor CS1. Simple circuit configuration of the memory cell 40 allows a high memory capacity and less frequent refresh operations. In other words, mounting the DOSRAM 120 on the MCU 100 enables a low-power MCU 100 with a high-capacity memory portion 115. However, the performance of the DOSRAM 120 as a memory module is heavily influenced by the electrical characteristics of the OS transistor (the transistor MW1), owing to the simple circuit configuration of the memory cell 40.

The OS transistor has a lower on-state current when compared with a Si transistor. Thus, the speed of reading data from and writing data to a memory cell of the DOSRAM 120 is slower than DRAM, whose memory cells are composed of Si transistors. As described above, data are written and read in units of the local array 235 in the DOSRAM 120. In other words, the DOSRAM 120 can perform pipeline operation by including the plurality of local arrays 235. Pipelining the operation of the DOSRAM 120 can reduce the access time and increase the throughput of the DOSRAM 120, enabling a performance increase of the MCU 100. A technique that enables a burst read with short latency is described below.

First, a more specific configuration example of the DOSRAM 120 is described. Here, the specifications of the DOSRAM 120 is set as follows, to facilitate an understanding of the configuration and operation of the DOSRAM 120.

One word is composed of 32 bits. The number of global bit lines is thus 64. The memory cells take an open bit line architecture. There are four local arrays 235. There are four memory cells per bit line. Thus, the numbers of word lines and bit lines per local array 235 are 4 and 64, respectively.

Figure 3:
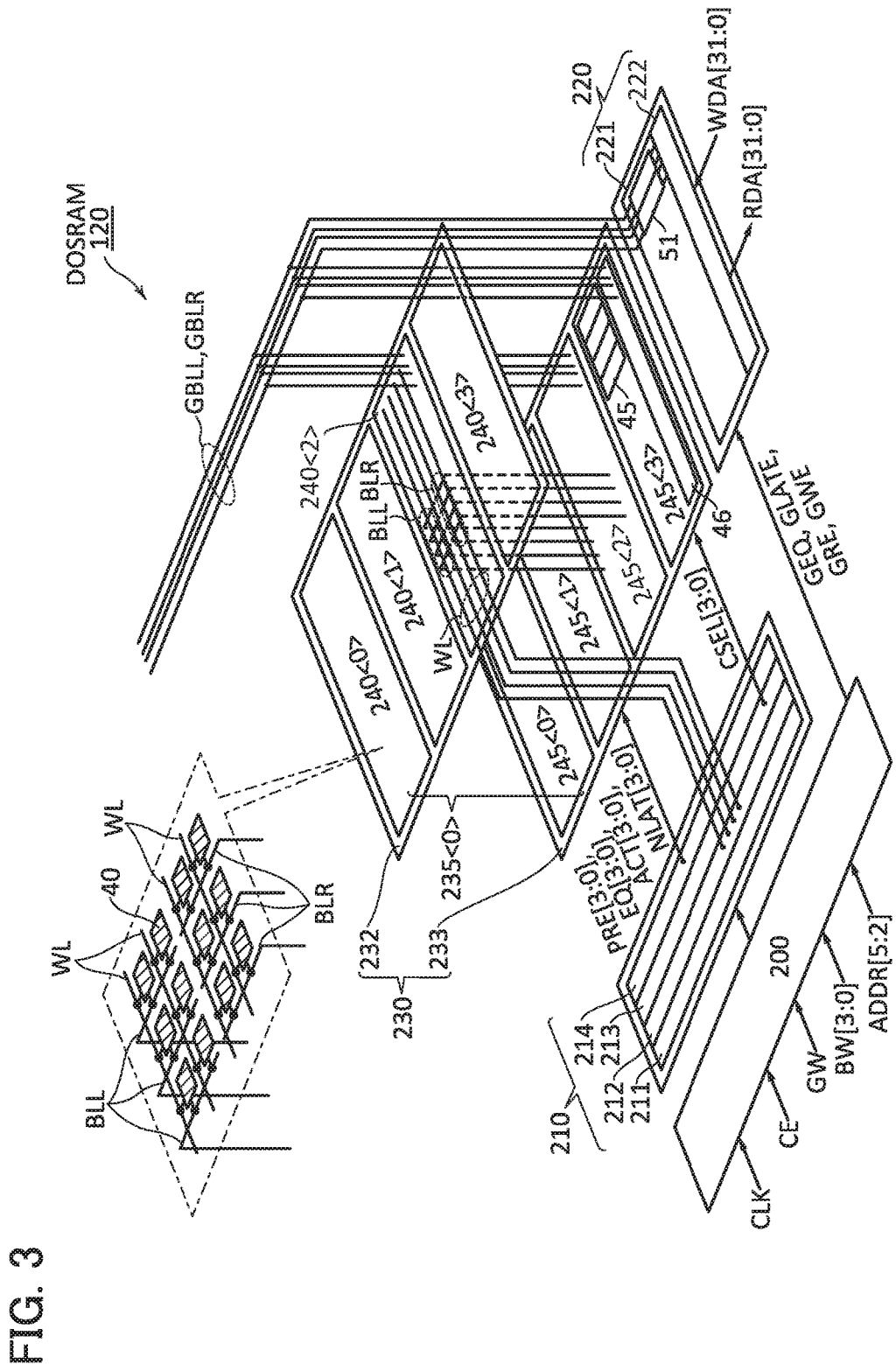
FIG. 3 is a block diagram illustrating a configuration example of DOSRAM.
Figure 4:
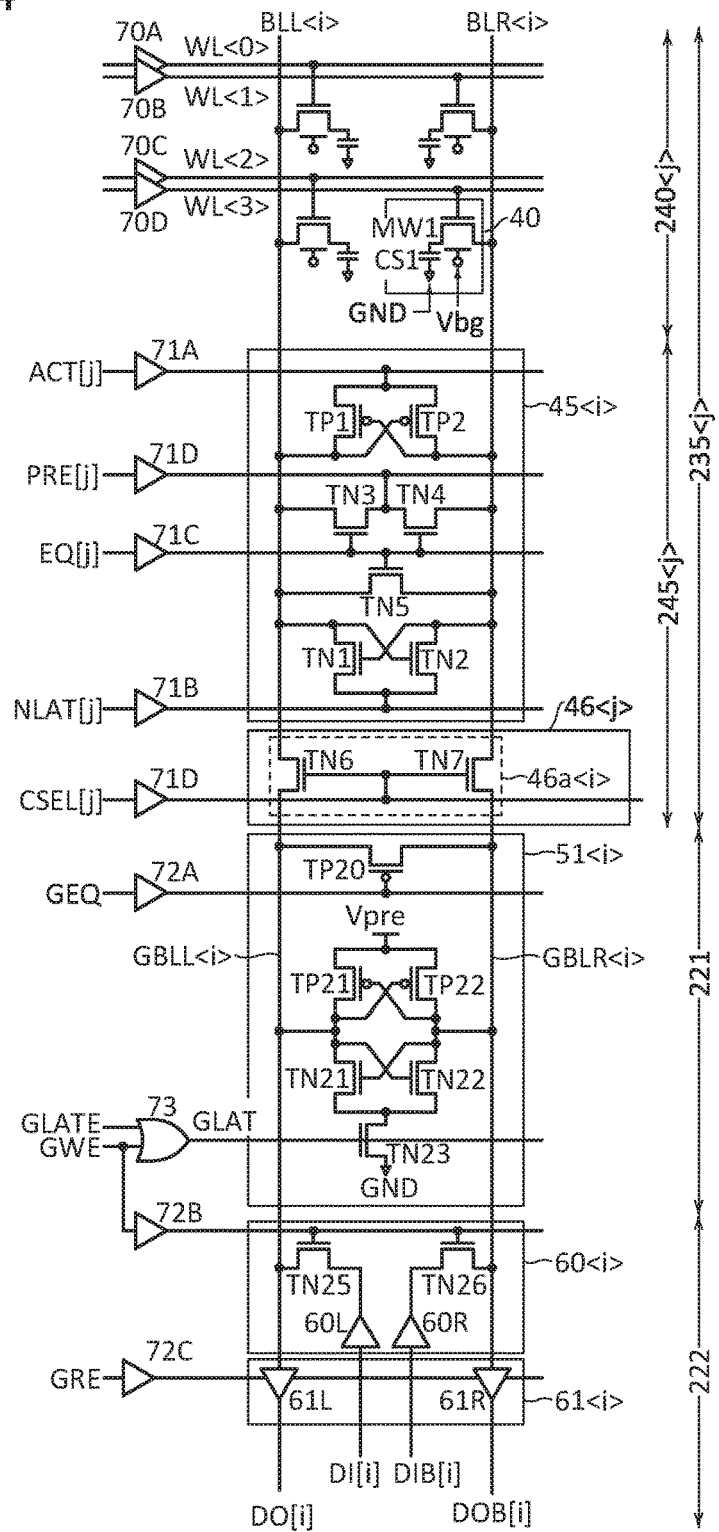
FIG. 4 is a circuit diagram illustrating a configuration example of a local array and a column circuit.

FIG. 3 is a block diagram illustrating a configuration example of the DOSRAM 120, which is configured according to the specifications above. FIG. 4 is a circuit diagram illustrating a configuration example of the local array 235 and the column circuit 220.

The configuration of the input and output signals of the DOSRAM 120 is as illustrated in FIG. 3. Higher two bits of signals ADDR[5:2] denote the address of the local array 235, and lower two bits of the signals ADDR[5:2] denote the row address.

The column selector 213 generates signals CSEL[3:0]. The sense amplifier driver 214 generates signals PRE[3:0], EQ[3:0], ACT[3:0], and NLAT[3:0]. The signals are output to the sense amplifier array 233.

The controller 200 inputs signals GEQ, GLATE, GRE, and GWE to the column circuit 220.

The MC-SA array 230 includes 32 global bit lines GBLL and 32 global bit lines GBLR. The global bit line GBLL and the global bit line GBLR form one global bit line pair. In the description hereinafter, the global bit line pair with the global bit line GBLL and the global bit line GBLR is also denoted as a global bit line pair (GBLL, GBLR). A bit line pair is also denoted in a similar manner. Thirty-two global bit line pairs (GBLL, GBLR) are stacked over the local memory cell array 240.

The memory cell array 232 includes local memory cell arrays 240<0> to 240<3>, and the sense amplifier array 233 includes local sense amplifier arrays 245<0> to 245<3>. A local array 235<j> (j is an integer greater than or equal to 0 and less than or equal to 3) has a stacked structure of the local sense amplifier array 245<j> and the local memory cell array 240<j>. FIG. 4 illustrates a configuration example of a circuit that is a component in the local array 235<j> and the column circuit 220.

Note that a reference numeral such as 240<0> is used when one local memory cell array needs to be specified within a plurality of local memory cell arrays in the DOSRAM 120, and a reference numeral such as 240 is used when the description refers to a given local memory cell array. The same principle applies to other components.

(Local Memory Cell Array 240)

The local memory cell array 240<j> includes word lines WL<0> to WL<3>, bit lines BLL<0> to BLL<31>, BLR<0> to BLR<31>, and 256 memory cells 40. In the memory cell 40, a wiring that supplies a ground potential (hereinafter referred to as a potential GND) is electrically connected to the terminal P1, and a wiring that supplies a potential Vbg is electrically connected to the terminal P2.

The selection signal generated by the word line driver 212 is input to the word lines WL<0> to WL<3> through buffers 70A to 70D.
(Local Sense Amplifier Array 245)

The local sense amplifier array 245<j> includes sense amplifiers 45<0> to 45<31> and a switch array 46<j>. Signals ACT[j], NLAT[j], EQ[j], and PRE[j] are input to the local sense amplifier array 245<j> through buffers 71A to 71D.

A sense amplifier 45<i> (i is an integer greater than or equal to 0 and less than or equal to 31) includes transistors TN1 to TN5 and transistors TP1 and TP2. The transistors TN1, TN2, TP1, and TP2 make up a latch sense amplifier. The signals ACT[j] and NLAT[j] are signals for supplying a power supply voltage to the sense amplifier 45<i>. The transistors TN3 to TN5 make up an equalizer. The equalizer has a function of smoothing the potentials of a bit line pair (BLL<i>, BLR<i>) and a function of precharging the same bit line pair. The signals EQ[j] and PRE[j] are control signals for the equalizer.

A signal CSEL[j] is input to the switch array 46<j> through a buffer 71D. The switch array 46<j> includes switch circuits 46a<0> to 46a<31>. A switch circuit 46a<i> includes transistors TN6 and TN7. The switch circuit 46a<i> has a function of controlling conduction between the bit line pair (BLL<i> and BLR<i>) and the global bit line pair (GBLL<i> and GBLR<i>).

FIG. 4 illustrates a configuration example of the switch array 46 where the number of bit line pairs per local array 235 is the same as the number of global bit line pairs. When there are more bit line pairs than there are global bit line pairs, the switch array 46 may be used as a multiplexer. For example, when the number of bit line pairs is 128, a multiplexer with 256 inputs and 64 outputs may be configured with 128 switch circuits 46a. In this case, the column selector 213 generates the signals CSEL[15:0], and signals CSEL[4j+3:4j] is input to the switch array 46<j>.
(Global Sense Amplifier Array 221)

The signal GEQ is input to the global sense amplifier array 221 through a buffer 72A, and the signals GLATE and GWE are input to the global sense amplifier array 221 through an OR circuit 73. Here, an output signal of the OR circuit 73 is referred to as a signal GLAT. The signal GLAT is a signal for activating the global sense amplifier array 221.

A global sense amplifier 51<i> is electrically connected to the global bit line pair (GBLL<i> and GBLR<i>). The global sense amplifier 51<i> includes transistors TN20 to TN23, TP21, and TP22. The global sense amplifier 51<i> is electrically connected to a wiring that supplies a potential Vpre and a wiring that supplies the potential GND. The transistor TN23 functions as a power switch that controls the supply of the potential GND. The transistor TP20 functions as an equalizer. The transistor TP20 smoothes the potential of the global bit line pair (GBLL<i> and GBLR<i>) in response to the signal GEQ.
(I/O Circuit 222)

The I/O circuit 222 has a function of generating 32-bit complementary data signals from data signals WDA[31:0], a function of writing the 32-bit complementary data signals to 32 global bit line pairs (GBLL and GBLR), a function of reading the 32-bit complementary data signals from the 32 global bit line pairs (GBLL and GBLR), and a function of generating data signals RDA[31:0] from the 32-bit complementary data signals that are read. Here, 32-bit complementary data signals that are written to the 32 global bit line pairs (GBLL and GBLR) are referred to as data signals DI[31:0] and DIB[31:0], and 32-bit complementary data signals that are read from the 32 global bit line pairs (GBLL and GBLR) are referred to as data signals DO[31:0] and DOB[31:0].

To the I/O circuit 222, a signal GWE is input through a buffer 72B, and a signal GRE is input through a buffer 72C. The I/O circuit 222 includes 32 input buffers 60 and 32 output buffers 61.

An input buffer 60<i> includes transistors TN25 and TN26, and buffers 60L and 60R. The input buffer 60<i> has a function of inputting data signals DI[i] and DIB[i] to the global bit lines GBLL<i> and GBLR<i> in response to the signal GWE. An output buffer 61<i> includes buffers 61L and 61R. The output buffer 61<i> has a function of outputting potentials of the global bit lines GBLL<i> and GBLR<i> as data signals DO[i] and DOB[i] in response to the signal GRE.
<<Operation Example of DOSRAM>>

The controller 200 performs a logical operation on the signals CE, GW, and BW[3:0] to determine the operation of the DOSRAM 120. Table 1 is a truth table for the operation of the DOSRAM 120. The DOSRAM 120 supports a standby mode, a burst read mode, three write modes (byte write, half word write, and word write), and a refresh mode. Here, there is only one read mode (the burst read mode), and the burst length is four.

TABLE 1

| Operation | CE | GW | BW [0] | BW [1] | BW [2] | BW [3] |
|---|---|---|---|---|---|---|
| Standby | L | X | X | X | X | X |
| Burst read | H | L | L | L | L | L |
| Byte write | H | H | H | L | L | L |
| Half word write | H | H | H | H | L | L |
| Word write | H | H | H | H | H | H |
| Refresh | H | H | L | L | L | L |

The time from when the address is determined to when data are output is referred to as an access time. One object of this embodiment is to reduce the access time of the DOSRAM 120 by burst transferring data.

(1) When the read operation is performed, data in the row to be read are destroyed due to the circuit configuration of the memory cell 40. Thus, after reading out the data of the memory cell 40 to the bit line, a data restore operation that writes data retained at the sense amplifier 45 back to the memory cell 40 is performed. When the operating frequency is high, for example, the same local array 235 cannot be accessed for the read operation in two consecutive clock cycles in some cases.

Accordingly, the controller 200 generates an address for the burst read qso as not to read data from the same local array 235 in two consecutive clock cycles.

(2) As described above, the memory cell 40 of the DOSRAM 120 is includes the OS transistor. Therefore, in the DOSRAM, it is difficult to make the time required to transfer data from the memory cell 40 to the bit line shorter than that of a DRAM. In contrast, the DOSRAM 120 can transfer data from the bit line pair to the global bit line pair at a speed similar to that of the DRAM as the OS transistor does not exist between the bit line pair and the global bit line pair.

Thus, in each of the local arrays 235, data that are read first in the burst read are written beforehand into the local sense amplifier array 245.

By employing the configuration described above, when there is a burst read request, the local array 235 that is to be accessed first can read out data in the row to be accessed from the local sense amplifier array 245 to the global sense amplifier array 221 without driving the local memory cell array 240. At this time, in the other local arrays 235, the data of the row to be accessed are read out from the local memory cell array 240 to the local sense amplifier array 245. Subsequently, data are read out from the local sense amplifier arrays 245 of these local arrays 235 to the global sense amplifier arrays 221 in a predetermined order.

Simply put, the aim of this embodiment is to enhance the performance of the DOSRAM 120 by applying techniques of "pipeline processing" and "prediction" to the burst read. The burst read of the DOSRAM 120 is described in detail below.

Table 2 illustrates the change of the internal address signal (signal ADDRi) during the burst read mode. Signals ADDRi [5:2] is generated in the controller 200. A sequential method is used for burst access.

TABLE 2

| | Burst length 4 | |
|---|---|---|
| Input | Internal | |
| ADDR [5:4] | ADDRi [5:4] (decimal) | ADDRi [3:2] |
| 00 | 0, 1, 2, 3 | 00 |
| 01 | 1, 2, 3, 0 | 01 |
| 10 | 2, 3, 0, 1 | 10 |
| 11 | 3, 0, 1, 2 | 11 |

The controller 200 generates the signals ADDRi[5:2] based on signals ADDR[5:4]. The signals ADDR[5:4] denote an address that specifies the local array. This address is referred to as a local array address. A row address (ADDRi[3:2]) is automatically determined from the local array address. In other words, in this burst read mode, lower bits (row address) of the internal address signal are fixed, while the higher bits (local array address) of the internal address signal are variable. Thus, each local array 235 is not accessed more than once in one burst read operation.

In addition, in each local array 235, the row that can be accessed first is predetermined. Thus, in each local array 235, the data of the row that can be accessed first can securely be retained at the local sense amplifier array 245.

Figure 5:
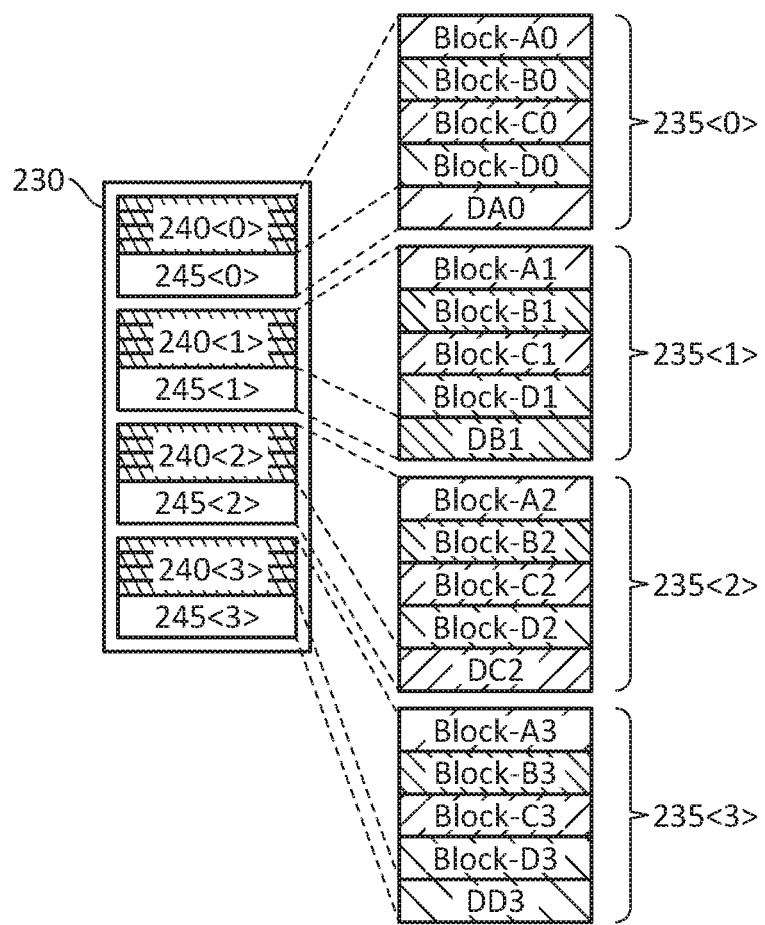
FIG. 5 illustrates a structure example of data stored in a local array.

FIG. 5 is a drawing for describing a structure of data stored in four local arrays 235. Each local memory cell array 240 are divided into four blocks, differentiated by row. The line width of each block is 32 bits. The term "block" here denotes a unit of memory that is selected by one address. The term "block" can be interchanged with the term "line." Here, the four blocks are referred to as blocks-A to -D. The blocks-A to -D are each composed of memory cells 40 that are electrically connected to one of the word lines WL<0> to WL<3>.

The block-A in the local memory cell array 240<0> is referred to as a block-A0, and a block-B in the local memory cell array 240<1> is referred to as a block-B1. Data retained at the block-A0 is referred to as data DA0, and data retained at the block-B1 is referred to as data DB1. Using this notation, the blocks that can be accessed first in the burst read mode are the blocks-A0 and -B1, and blocks-C2 and -D3.

FIG. 5 illustrates a structure of data stored in the MC-SA array 230 that is in an idle state. Each of the local sense amplifier arrays 245<0>, 245<1>, 245<2>, and 245<3> retains the data DA0 and DB1, and data DC2 and DD3, respectively. In other words, each of the local sense amplifier arrays 245<0> to 245<3> stores data for one word that is read first.

Figure 6:
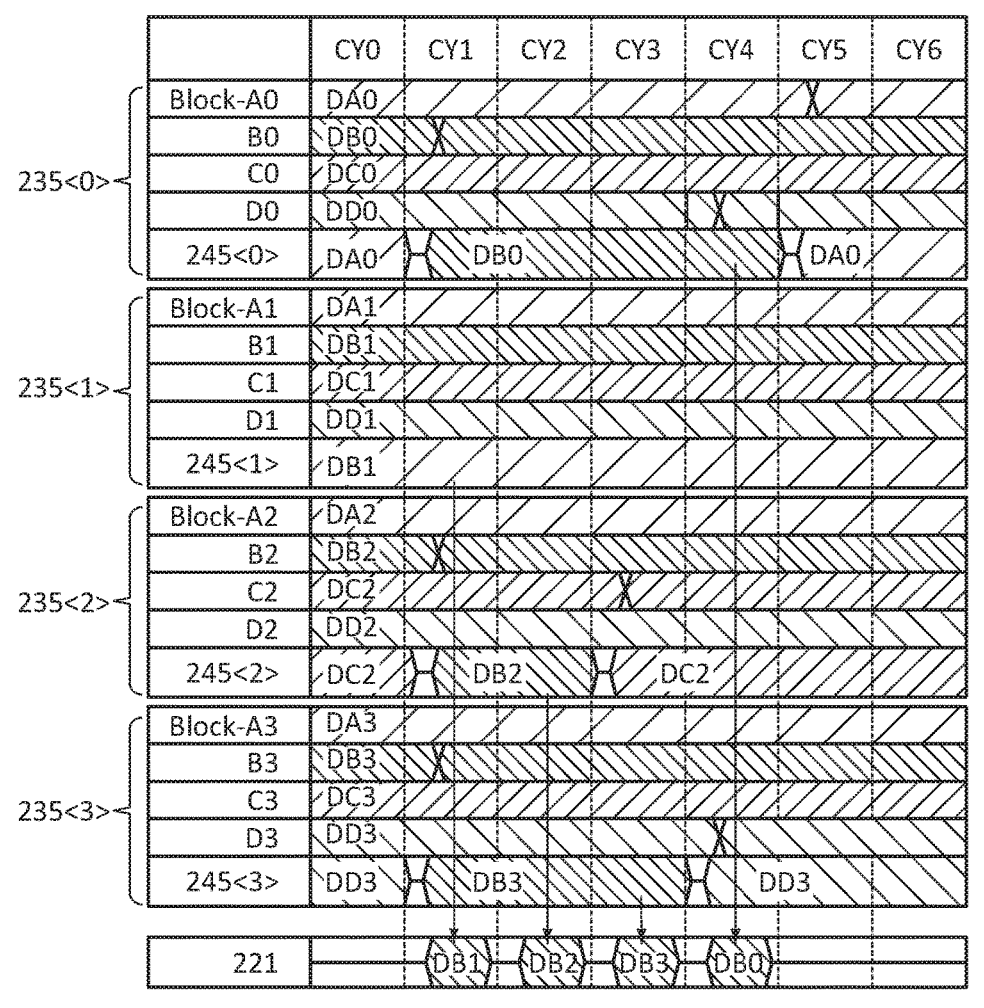

FIG. 6 illustrates an example of the burst read operation of the DOSRAM 120. Intervals in FIG. 6 (e.g., CY0) represent clock cycles.

In the clock cycle CY0, the local arrays 235<0> to 235<3> are in the idle state. The local sense amplifier arrays 245<0>, 245<1>, 245<2>, and 245<3> retain the data DA0, DB1, DC2, and DD3, respectively. For the ease of description, such a state of the local sense amplifier array 245 is referred to as a burst standby state here. When the local sense amplifier array 245 is in the burst standby state, the local sense amplifier array 245 is retaining the data to be read first in the burst access.

In a clock cycle CY1, a 1′b1 signal CE and a 1′b0 signal WE are input to the DOSRAM 120. The controller 200 controls the row circuit 210 and the column circuit 220 so that the burst read operation is performed. Here, the signals ADDR[5:4] that are input to the controller 200 during the clock cycle CY1 is assumed as 2′b01. The block-B1 of the local array 235<1> thus becomes the first block to be accessed; the data DB1 retained at the local sense amplifier array 245<1> is written into the global sense amplifier array 221 without driving the block-B1.

In the other local arrays 235, i.e., each of the local arrays 235<0>, 235<2>, and 235<3>, data of a block to be accessed are read out to the corresponding local sense amplifier array 245. In the local array 235<0>, data DB0 of a block-B0 are read out to the local sense amplifier array 245<0> and retained therein. In addition, the data restore operation of the block-B0 is also performed. The local arrays 235<2> and 235<3> operate in a similar manner.

In the clock cycle CY1, the data DB1 are written from the local sense amplifier array 245<1> to the global sense amplifier array 221. In a clock cycle CY2, data DB2 are written from the local sense amplifier array 245<2> to the global sense amplifier array 221. In a clock cycle CY3, data DB3 are written from the local sense amplifier array 245<3> to the global sense amplifier array 221. In a clock cycle CY4, the data DB0 are written from the local sense amplifier array 245<0> to the global sense amplifier array 221. In other words, the DOSRAM 120 can read the first data within the clock cycle during which the burst read request is made. Furthermore, the DOSRAM 120 can read data of four words within four clock cycles.

In other words, the number of clock cycles needed for the burst read operation can be reduced by applying the techniques of "pipeline processing" to the burst read operation. For example, when an operation in which data are read out from the local memory cell array 240 to the local sense amplifier array 245 spends more than one clock cycle, the timing for the second data to be read after the first data amounting to one word are read is delayed because the time for a data read operation exceeds one clock cycle. However, the second to fourth data can be read in three consecutive clock cycles.

In addition, the access time of the DOSRAM 120 can be reduced because the local sense amplifier array 245 in the idle state retains the data that are to be read first in the burst transfer (this is a technique known as 'prediction'). Accordingly, an operation to shift the local sense amplifier array 245 into the burst standby state is performed in the local arrays 235 that are to be accessed second or later during the burst read operation. This is to ensure that each of the local sense amplifier arrays 245 is retaining given data when it returns to the idle state.

In the local array 235<2>, during a clock cycle CY3, the data DC2 of a block-C2 are read out to the local sense amplifier array 245<2> and the data restore operation is performed on the block-C2. In the local array 235<3>, during a clock cycle CY4, the data DD3 of the block-D3 are read out to the local sense amplifier array 245<3> and the data restore operation is performed on the block-D3. In the local array 235<0>, during a clock cycle CY5, the data DA0 of the block-A0 are read out to the local sense amplifier array 245<0> and the data restore operation is performed on the block-A0. Each of the local arrays 235 can be returned to the burst standby state by performing this operation. Thus, when the next burst read is requested, the first data can be read from the DOSRAM 120 in the clock cycle period in which the input address is determined.

In the clock cycle CY4, data reading of 4 words is completed, and the global sense amplifier array 221 enters the idle state. Thus, the write operation or the burst read can be performed in the next clock cycle (CY5). When there are write requests in a local array 235 other than the local array 235<0> during the clock cycle CY5, an operation to write back the data DA0 to the local sense amplifier array 245<0> is also performed during the clock cycle CY5. In addition, when the burst read is requested in the clock cycle CY5 and the local array 235<0> is to be read first, exception handling is performed. This is because the data DA0 is not yet written back to the local sense amplifier array 245<0>. Therefore, in this case, the read of the first data DA0 is delayed by one clock cycle and performed during a clock cycle CY6. In other cases, the first one word of data can be read during the clock cycle CY5.

As described above, the retention of data that are to be read first during the burst transfer at the local sense amplifier array 245 beforehand allows a reduction of the access time. Accordingly, even in the case of the write operation, an operation to return the local sense amplifier array 245 to the burst standby state is performed in the local array 235 to which data are to be written.

This operation is described with a case in which data are to be written to a block-C1. The data in the global sense amplifier array 221 are written to the local sense amplifier array 245<1> and then retained therein. Next, data DC1 of the block-C1 are updated with the data retained at the local sense amplifier array 245<1>. The above operation is performed within one clock cycle. In the next clock cycle, an operation to read out the data DB1 of the block-B1 to the local sense amplifier array 245<1> is performed.

In this example, if effective data are written into the block-B1, the data retained at the local sense amplifier array 245<1> may be updated after the write operation. For this purpose, flags that indicate whether effective data are written into the blocks-A0, -B1, -C2, and -D3 (hereinafter referred to as flags a0, b1, c2, and d3) may be used, for example. The flags a0, b1, c2, and d3 may be stored in a register of the controller 200. The DOSRAM 120 does not have any data written therein immediately after power is turned on, thus the flags a0, b1, c2, and d3 are not effective. The controller 200 makes the flag b1 effective when data are first written into the block-B1. For example, when the flag b1 is effective and there is a write access to the block-C1, the data DB1 of the block-B1 are read out to the local sense amplifier array 245<1> during the clock cycle following the clock cycle during which data are written to the block-C1.

In summary, the operation to bring the local sense amplifier array 245 into the burst standby state may be performed during a clock cycle after data are transferred between the local sense amplifier array 245 and the global sense amplifier array 221, regardless of the operation performed (the burst read operation or the write operation). This enables the local sense amplifier array 245 to automatically return to the burst standby state when the burst read operation or the write operation is performed.

There are some cases where the operation to bring the local sense amplifier array 245 into the burst standby state is not needed. For example, during the burst read operation, the data of the local sense amplifier array 245 do not need to be updated in the local array 235 from which data are read first. Examples of such cases in the write operation include a case where the block to which data are to be written is the block from which data are to be read first during the burst transfer, and a case where effective data are not written to the block from which data are to be read first during the burst transfer. In those cases, the controller 200 may perform the exception handling as appropriate, so as not to perform the operation to return the local sense amplifier array 245 to the burst standby state.

Several embodiments of the DOSRAM 120 are described below.

Configuration Example-a1

The burst length can be changed. For example, the bus 110 generates signals BLN[1:0] that specify the burst length. The signals BLN[1:0] are input to the controller 200. For example, when the signals BLN[1:0] are 2'b00, 2'b01, or 2'b10, the burst length is one, two, or four, respectively. When the signal CE (1'b1) and the signal WE (1'b0) are input to the controller 200, the signals ADDR[5:4] are 2'b10, and the signals BLN[1:0] are 2'b01, the operating mode is a burst read mode with a burst length of two, which results in the data DC2 and data DD2 being read from the DOSRAM 120.

Configuration Example-a2

The line width of the blocks-A to -D in the local memory cell array 240 may be larger than one word. For example, when the number of bit lines in the local memory cell array 240 is 258, the line width of the blocks-A to -D is four words. In this case, 128 sense amplifiers 45 are provided in the local sense amplifier array 245. In the switch array 46, 128 switch circuits 46a are provided. The switch array 46 serves as a multiplexer. Specifically, the switch array 46 has a function of selecting 32 pairs from the 128 local bit line pairs (BLL, BLR) and electrically connecting the selected local bit line pairs to the global bit line pair (GBLL, GBLR). In this example, the column selector 213 generates the signals CSEL[15:0]. The signals CSEL[4j+3:4j] is input to the switch array 46<j> of the local sense amplifier array 245<j>.

Signals ADDR[7:2] are input to the controller 200 as external address signals. Signals ADDR[7:6] denote the local array address, the signals ADDR[5:4] denote the row address, and the signals ADDR[3:2] denote the column address. Table 3 illustrates the change of the internal address signal (signal ADDRi) during the burst read mode. Signals ADDRi[7:2] are generated in the controller 200. The burst length is four words. During the burst read operation, in the local array 235 from which data are to be read, data of a column specified by the signals ADDRi[3:2] are output from the local sense amplifier array 245 to the global sense amplifier array 221.

TABLE 3

Burst length 4

| Input ADDR [7:6] | Internal ADDRi [7:6] (decimal) | Internal ADDRi [5:4] | Internal ADDRi [3:2] |
|---|---|---|---|
| 00 | 0, 1, 2, 3 | 00 | Same as ADDR [3:2] |
| 01 | 1, 2, 3, 0 | 01 | |
| 10 | 2, 3, 0, 1 | 10 | |
| 11 | 3, 0, 1, 2 | 11 | |

Configuration Example-a3

The number of local arrays 235 per MC-SA array 230 is not limited to four. In addition, the number of blocks per local array 235 is not limited to four. The number of blocks per local array 235 is preferably $2^x$ (x is an integer greater than or equal to 2). The number of local arrays 235 is preferably an integral multiple of the number of blocks per local array 235. Alternatively, the number of local arrays 235 is preferably an integral multiple of the maximum burst length. The DOSRAM 120 with high usage efficiency and high controllability can be obtained by optimizing the number of local arrays 235 or the number of blocks per local array 235.

For example, when the maximum burst length is 16 and the number of blocks per local array 235 is eight, the number of local arrays 235 is preferably 16, 32, 48, 64, 128, or the like.

In the following description, a configuration example in which the number of blocks per local array 235 is four, the number of local arrays 235 is 16, and the line width of a block is one word is described. In this example, the signals ADDR[7:2] are used as address signals. Signals ADDR[7:4] denote the local array address, and the signals ADDR[3:2] denote the row address.

The burst length can be changed to 16, eight, or four. To change the burst length, for example, signals BLN[2:0] are input to the controller 200. When the signals BLN[2:0] are 3'b100, 3'b011, or 3'b010, the burst length is set as 16 ($2^4$), 8 ($2^3$), and 4 ($2^2$), respectively.

Figure 7:
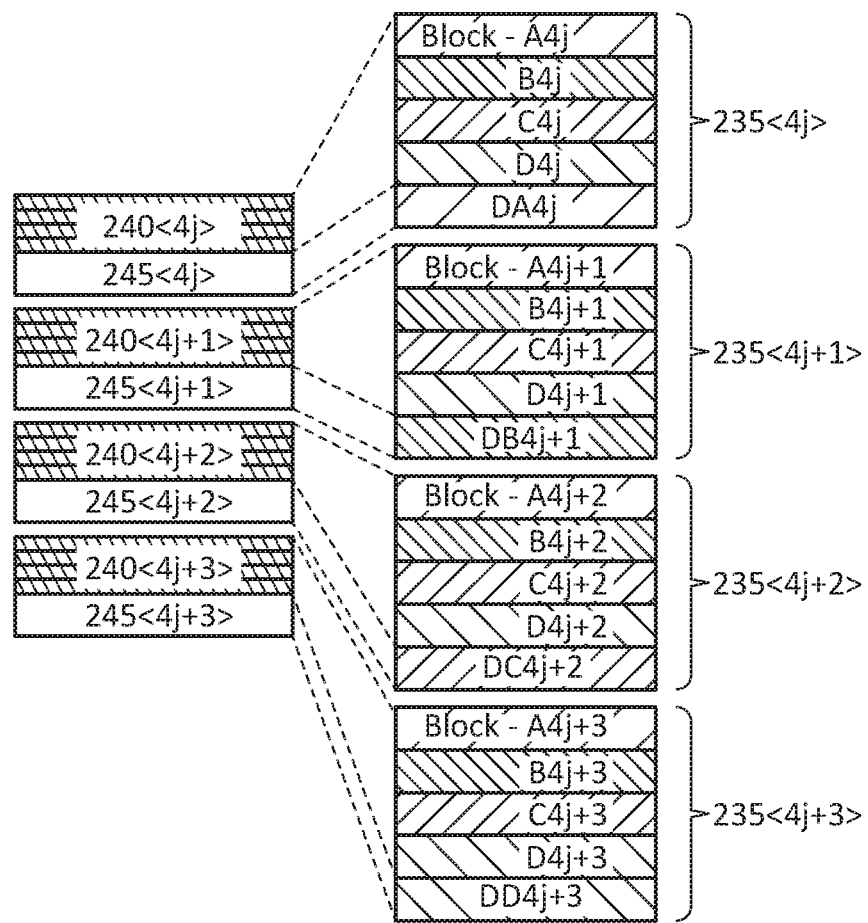
FIG. 7 illustrates a structure example of data stored in a local array.

Because the number of blocks per local array 235 is four, the controller 200 controls four local arrays 235 at once. An example of data stored in local arrays 235<4j> to 235<4j+3> is illustrated in FIG. 7.

In the local memory cell arrays 240<4j>, 240<4j+1>, 240<4j+2>, and 240<4j+3>, the first blocks that can be accessed first during the burst transfer are blocks A4j, B4j+1, C4j+2, and D4j+3, respectively. Accordingly, the local sense amplifier arrays 245<4j>, 245<4j+1>, 245<4j+2>, and 245<4j+3> in the burst standby state retain data DA4j, DB4j+1, DC4j+2, and DD4j+3, respectively. For example, local sense amplifier arrays 245<8>, 245<9>, 245<10>, and 245<11> retain data DA8 of a block-A8, data DB9 of a block-B9, data DC10 of a block-C10, and data D11 of a block-D11, respectively.

Tables 4 to 6 illustrate the change during the burst read operation of the signals ADDRi[7:2] that are generated by the controller 200. In Tables 4, 5, and 6, the burst lengths are 16, eight, and four, respectively. The signals ADDRi[3:2] illustrate the row address, and these signals are the same as the signals ADDR[5:4].

TABLE 4

Burst length 16 (BLN[2:0] = 100)

| Input ADDR [7:4] | Internal ADDRi [7:4] (decimal) | Internal ADDRi [3:2] |
|---|---|---|
| 0000 | 0, 1, 2, 3, 4, 5, 6, 7, 8, 9, 10, 11, 12, 13, 14, 15 | 00 |
| 0001 | 1, 2, 3, 4, 5, 6, 7, 8, 9, 10, 11, 12, 13, 14, 15, 0 | 01 |
| 0010 | 2, 3, 4, 5, 6, 7, 8, 9, 10, 11, 12, 13, 14, 15, 0, 1 | 10 |
| 0011 | 3, 4, 5, 6, 7, 8, 9, 10, 11, 12, 13, 14, 15, 0, 1, 2 | 11 |
| 0100 | 4, 5, 6, 7, 8, 9, 10, 11, 12, 13, 14, 15, 0, 1, 2, 3 | 00 |
| 0101 | 5, 6, 7, 8, 9, 10, 11, 12, 13, 14, 15, 0, 1, 2, 3, 4 | 01 |
| 0110 | 6, 7, 8, 9, 10, 11, 12, 13, 14, 15, 0, 1, 2, 3, 4, 5 | 10 |
| 0111 | 7, 8, 9, 10, 11, 12, 13, 14, 15, 0, 1, 2, 3, 4, 5, 6 | 11 |
| 1000 | 8, 9, 10, 11, 12, 13, 14, 15, 0, 1, 2, 3, 4, 5, 6, 7 | 00 |
| 1001 | 9, 10, 11, 12, 13, 14, 15, 0, 1, 2, 3, 4, 5, 6, 7, 8 | 01 |
| 1010 | 10, 11, 12, 13, 14, 15, 0, 1, 2, 3, 4, 5, 6, 7, 8, 9 | 10 |
| 1011 | 11, 12, 13, 14, 15, 0, 1, 2, 3, 4, 5, 6, 7, 8, 9, 10 | 11 |
| 1100 | 12, 13, 14, 15, 0, 1, 2, 3, 4, 5, 6, 7, 8, 9, 10, 11 | 00 |
| 1101 | 13, 14, 15, 0, 1, 2, 3, 4, 5, 6, 7, 8, 9, 10, 11, 12 | 01 |
| 1110 | 14, 15, 0, 1, 2, 3, 4, 5, 6, 7, 8, 9, 10, 11, 12, 13 | 10 |
| 1111 | 15, 0, 1, 2, 3, 4, 5, 6, 7, 8, 9, 10, 11, 12, 13, 14, | 11 |

TABLE 5

Burst length 8 (BLN[2:0] = 011)

| Input ADDR [7:4] | Internal ADDRi [7:4] (decimal) | Internal ADDRi [3:2] |
|---|---|---|
| 0000 | 0, 1, 2, 3, 4, 5, 6, 7 | 00 |
| 0001 | 1, 2, 3, 4, 5, 6, 7, 0 | 01 |
| 0010 | 2, 3, 4, 5, 6, 7, 0, 1 | 10 |
| 0011 | 3, 4, 5, 6, 7, 0, 1, 2 | 11 |
| 0100 | 4, 5, 6, 7, 0, 1, 2, 3 | 00 |
| 0101 | 5, 6, 7, 0, 1, 2, 3, 4 | 01 |
| 0110 | 6, 7, 0, 1, 2, 3, 4, 5 | 10 |
| 0111 | 7, 0, 1, 2, 3, 4, 5, 6 | 11 |
| 1000 | 8, 9, 10, 11, 12, 13, 14, 15 | 00 |
| 1001 | 9, 10, 11, 12, 13, 14, 15, 8 | 01 |
| 1010 | 10, 11, 12, 13, 14, 15, 8, 9 | 10 |
| 1011 | 11, 12, 13, 14, 15, 8, 9, 10 | 11 |
| 1100 | 12, 13, 14, 15, 8, 9, 10, 11 | 00 |
| 1101 | 13, 14, 15, 8, 9, 10, 11, 12 | 01 |
| 1110 | 14, 15, 8, 9, 10, 11, 12, 13 | 10 |
| 1111 | 15, 8, 9, 10, 11, 12, 13, 14 | 11 |

TABLE 6

Burst length 4 (BLN[2:0] = 010)

| Input ADDR [7:4] | Internal ADDRi [7:4] (decimal) | Internal ADDRi [3:2] |
|---|---|---|
| 0000 | 0, 1, 2, 3 | 00 |
| 0001 | 1, 2, 3, 0 | 01 |
| 0010 | 2, 3, 0, 1 | 10 |
| 0011 | 3, 0, 1, 2 | 11 |
| 0100 | 4, 5, 6, 7 | 00 |
| 0101 | 5, 6, 7, 4 | 01 |
| 0110 | 6, 7, 4, 5 | 10 |
| 0111 | 7, 4, 5, 6 | 11 |
| 1000 | 8, 9, 10, 11 | 00 |
| 1001 | 9, 10, 11, 8 | 01 |
| 1010 | 10, 11, 8, 9 | 10 |
| 1011 | 11, 8, 9, 10 | 11 |
| 1100 | 12, 13, 14, 15 | 00 |
| 1101 | 13, 14, 15, 12 | 01 |
| 1110 | 14, 15, 12, 13 | 10 |
| 1111 | 15, 12, 13, 14 | 11 |

<<Memory Hierarchy in the MCU>>

Figure 8:
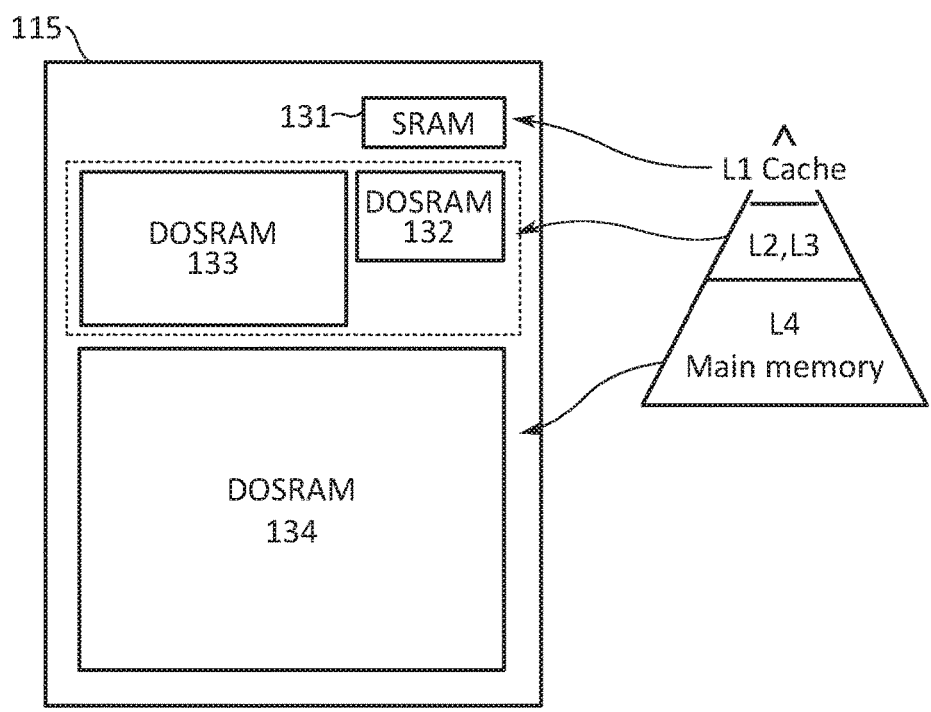
FIG. 8 is a block diagram illustrating a configuration example of a memory portion in an MCU.

DOSRAM does not need to be set to the refresh mode as often as DRAM because the memory cell of DOSRAM includes an OS transistor. Thus, the time allotted for the processor core to access the memory can be made sufficiently longer than that of DRAM. In addition, DOSRAM with low latency can be obtained by applying the burst read in this embodiment. Accordingly, this embodiment enables DOSRAM to be used as a low-level memory (e.g., L2 or L3). For example, the memory portion 115 can take a hierarchical structure using a plurality of DOSRAM modules. FIG. 8 illustrates a configuration example of the memory portion 115.

The memory portion 115 illustrated in FIG. 8 includes an SRAM 131 and DOSRAMs 132 to 134. The SRAM 131 is the highest-level (L1) memory, and functions as a cache memory. The DOSRAMs 132 to 134 are L2 to L4 memory, respectively.

The DOSRAMs 132 to 134 have configurations similar to that of the DOSRAM 120. Among the DOSRAM modules, the memory capacity of the DOSRAM 132 is the lowest, and that of the DOSRAM 134 is the highest. Techniques to increase the memory capacity of DOSRAM include increasing the number of local arrays, increasing the number of bit lines per local array, increasing memory cells per bit line, and the like.

For high-speed operation, the DOSRAM 132 and 133 are configured with the burst read mode of this embodiment. The DOSRAM 134 is the lowest-level (L4) memory, and functions as a main memory. The read mode of the DOSRAM 134 is single-read mode only. Note that the burst read mode functionality may be added to the DOSRAM 134. The DOSRAM 134 in the memory portion 115 is allowed to operate at the lowest speed among the DOSRAMs 132 to 134; therefore, the storage capacitance of the DOSRAM 134 can be made larger than the other DOSRAM modules. This allows the DOSRAM 134 to be refreshed less often, reducing the power consumption overhead of the DOSRAM 134 that accompanies the memory capacity increase.

This embodiment is realized owing to an effective application of the circuit configuration of DOSRAM. Pipelining the burst read operation of the DOSRAM 120 can reduce the latency of the DOSRAM 120, and, by extension, increase the performance of the MCU 100.

The number of pipeline stages in the DOSRAM 120 corresponds to the number of local arrays 235. Thus, the maximum burst length of the DOSRAM 120 may be limited by the number of pipeline stages in the DOSRAM 120. The number of memory cells per bit line in the DOSRAM 120 (Nmc/BL) can be made smaller than that of DRAM. Accordingly, when the number of word lines and the bit lines are the same, the DOSRAM 120 can include a larger number of local arrays 235 than DRAM. Because of this, the maximum burst length of the DOSRAM 120 can easily be made large.

Nmc/BL of the DOSRAM 120 is low because the memory cell 40 of the DOSRAM 120 includes the OS transistor, and because the local memory cell array 240 can be stacked over the local sense amplifier array 245 as a result. In addition, a low Nmc/BL enables a short bit line, which results in reduced bit line capacitance. This allows a capacitance reduction in the capacitor CS1 of the memory cell 40, enabling a high-speed DOSRAM 120.

For example, the Nmc/BL of the DOSRAM 120 can be greater than or equal to 2 and less than or equal to 128. Nmc/BL is preferably $2^x$ (X is an integer greater than or equal to 2 and less than or equal to 7) from the perspectives of controllability and bit line throughput, for example. As described above, the number of blocks per local array 235 is determined by the Nmc/BL. Therefore, Nmc/BL of 4, 8, 16 or 32 is preferable, when factors such as controllability during the burst transfer and usage efficiency and area of the local array 235 are taken into account.

Although a DRAM design with Nmc/BL of 4 or 8 is possible, it is not viable as a product because of its high cost per bit. In contrast, the DOSRAM 120 can have a small Nmc/BL while also keeping the cost per bit low.

Embodiment 2

In this embodiment, an IC chip, an electronic component, electronic devices, and the like are described as examples of a semiconductor device.

<Example of Manufacturing Method of Electronic Component>

Figure 9A:
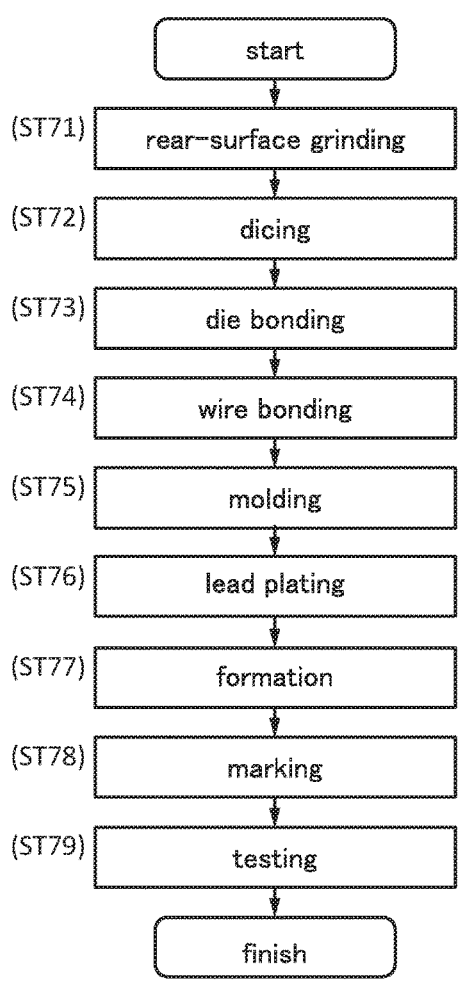
FIG. 9A is a flow chart illustrating an example of a manufacturing method of an electronic component.

FIG. 9A is a flow chart illustrating an example of a method for manufacturing an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor is completed by integrating detachable components on a printed board through the assembly process (post-process). The post-process can be completed through steps shown in FIG. 9A. In a pre-process, first, a semiconductor device of one embodiment of the present invention and the like are fabricated on a semiconductor wafer (e.g., a silicon wafer).

Figure 9B:
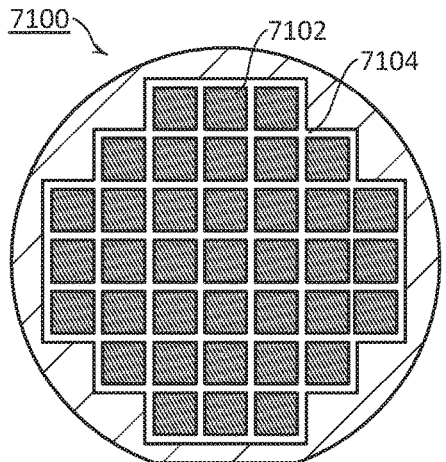
FIG. 9B is a top view of a semiconductor wafer.
Figure 9C:
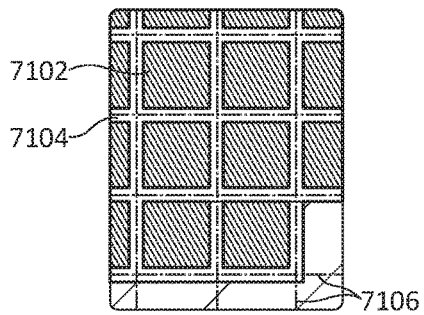
FIG. 9C is a partially enlarged view of a semiconductor wafer.

In the post-process, first, a rear-surface grinding step in which a rear surface of the semiconductor wafer (a surface on which a semiconductor device and the like are not formed) is ground is performed (Step ST71). This step aims to reduce the size of the electronic component by thinning the semiconductor wafer through grinding. FIG. 9B is a top view illustrating an example of the semiconductor wafer after being subjected to Step ST71. FIG. 9C is a partially enlarged view of FIG. 9B. A semiconductor wafer 7100 illustrated in FIG. 9B has a plurality of circuit regions 7102. A semiconductor device of one embodiment of the present invention (e.g., the MCU or the memory device) is provided in the circuit region 7102. After Step ST71, a dicing step of separating the semiconductor wafer into a plurality of chips is performed (Step ST72).

Figure 9D:
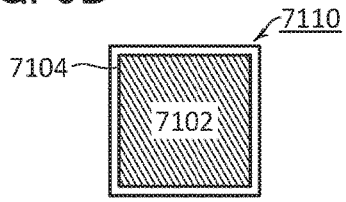
FIG. 9D is a schematic diagram illustrating a configuration example of a chip.

The circuit regions 7102 are each surrounded by a separation region 7104. Separation lines (also referred to as dicing lines) 7106 are set at a position overlapping with the separation regions 7104. In the dicing step, the semiconductor wafer 7100 is cut along the separation lines 7106, whereby chips 7110 including the circuit regions 7102 are cut out from the semiconductor wafer 7100. FIG. 9D is an enlarged view of the chip 7110.

Next, a die bonding step in which the separated chips 7110 are separately picked up and bonded on a lead frame is performed (Step ST73). In the die bonding step, the chip 7110 may be bonded to the lead frame by an appropriate method depending on the product, for example, with a resin or a tape. The chip 7110 may be bonded to an interposer substrate instead of the lead frame.

Next, a wire bonding step of electrically connecting a lead of the lead frame and an electrode on the chip 7110 with a metal wire is performed (Step ST74). As the metal wire, a silver wire, a gold wire, or the like can be used. For wire bonding, ball bonding or wedge bonding can be employed, for example. The wire-bonded chip 7110 is subjected to a molding step of sealing the chip with an epoxy resin or the like (Step ST75).

Subsequently, the lead of the lead frame is plated in a lead plating step (Step ST76). Then, the lead is cut and processed into a predetermined shape in a formation step (Step ST77). A printing (marking) step is performed on a surface of the package (Step ST78). After a testing step (Step ST79) for checking whether an external shape is acceptable and whether there is a malfunction, for example, the electronic component is completed.

Figure 9E:
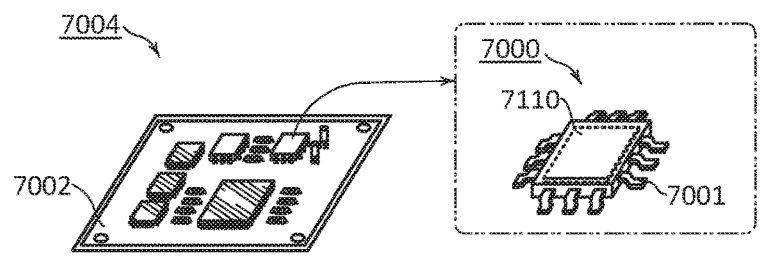
FIG. 9E is a schematic diagram illustrating a configuration example of an electronic component.

FIG. 9E is a schematic perspective view of a completed electronic component. FIG. 9E illustrates a schematic perspective view of a quad flat package (QFP) as an example of the electronic component. An electronic component 7000 illustrated in FIG. 9E includes a lead 7001 and a chip 7110. The electronic component 7000 may include a plurality of chips 7110.

The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes the MCU of Embodiment 1. Embodiment 1 enables a latency reduction in DOSRAM, whereby low-power DOSRAM can be embedded in the MCU without decreasing the performance of the overall MCU system. Thus, the incorporation of the electronic component 7000 into the electronic device can introduce features such as low power, versatility, high performance, or the like to the electronic device.

Structure examples of electronic devices are described with reference to FIGS. 10A to 10F. A touch panel device including a touch sensor is preferably used for display portions of the electronic devices in FIG. 10A and the like. With the touch panel device, the display portion can also function as an input portion of the electronic device.

Figure 10A:
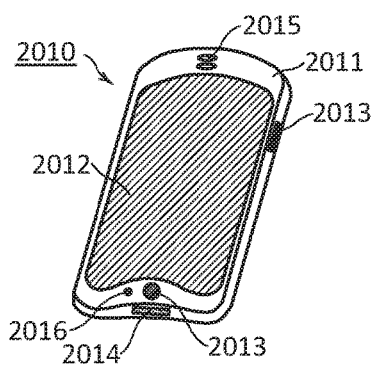
FIGS. 10A to 10F each illustrate a configuration example of an electronic device.

An information terminal 2010 illustrated in FIG. 10A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various kinds of operation such as making a call, inputting letters, and switching screen images on the display portion 2012 can be performed by touching the display portion 2012 with a finger or the like. The information terminal 2010 can be operated by inputting sound from the microphone 2016. Moreover, a variety of operations such as power on/off operation and screen switching of the display portion 2012 can be performed by pressing the operation button 2013.

A notebook PC 2050 in FIG. 10A includes a housing 2051, a display portion 2052, a keyboard 2053, and a pointing device 2054. The notebook PC 2050 can be operated by touch operation on the display portion 2052.

Figure 10B:
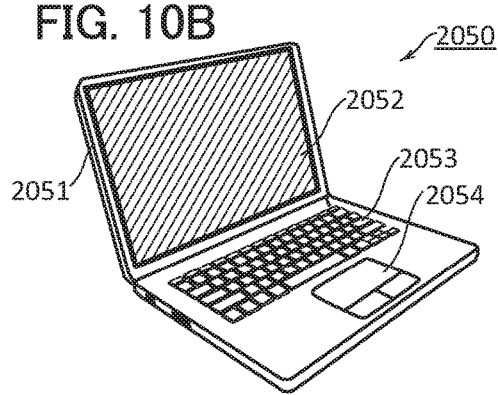
Figure 10C:
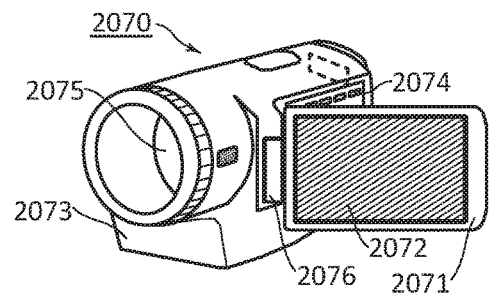

A video camera 2070 in FIG. 10B includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. A variety of operations such as start and stop of recording, zoom adjustment, and change of shooting range can be executed by touch operation on the display portion 2072.

Figure 10D:
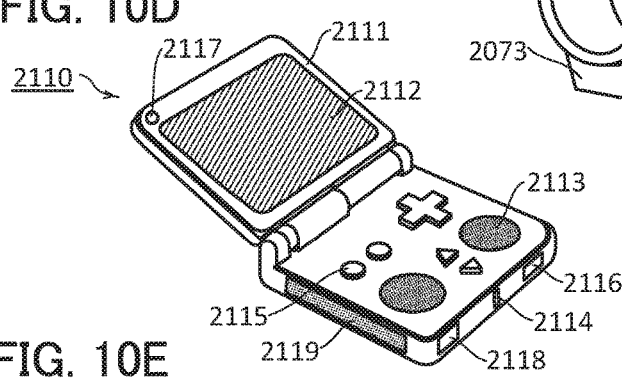

A portable game machine 2110 in FIG. 10D includes a housing 2111, a display portion 2112, speakers 2113, an LED lamp 2114, operation key buttons 2115, a connection terminal 2116, a camera 2117, a microphone 2118, and a recording medium read portion 2119.

Figure 10E:
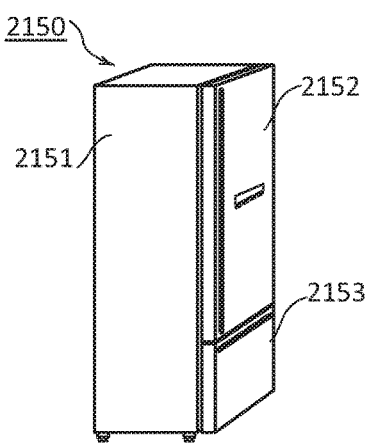

An electric refrigerator-freezer 2150 in FIG. 10E includes a housing 2151, a refrigerator door 2152, a freezer door 2153, and the like.

Figure 10F:
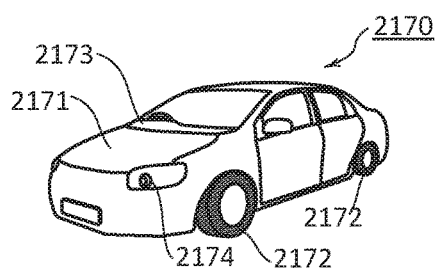

A motor vehicle 2170 in FIG. 10F includes a car body 2171, wheels 2172, a dashboard 2173, lights 2174, and the like. The MCU in Embodiment 1 is used as each of processors in the motor vehicle 2170.

Embodiment 3

Figure 11A:
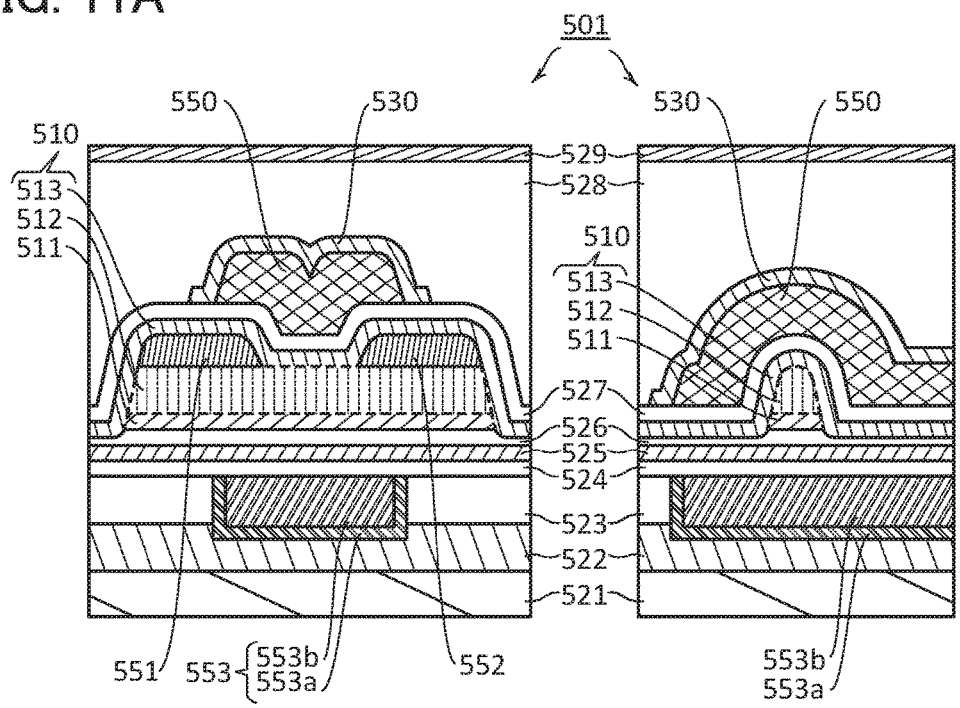
FIGS. 11A and 11B are planar cross-sectional views each illustrating a structure example of a transistor.

In this embodiment, a metal oxide transistor is described.
<<OS Transistor Structure Example 1>>
FIG. 11A illustrate a structural example of a transistor. A transistor 501 illustrated in FIG. 11A is a metal oxide transistor. A cross section of the transistor 501 in the channel length direction is illustrated on the left drawing of FIG. 11A, and a cross section of the transistor 501 in the channel width direction is illustrated on the right drawing of FIG. 11A.

A transistor 501 is formed over an insulating surface. Here, the transistor 501 is formed over an insulating layer 521. The transistor 501 is covered with insulating layers 528 and 529. The transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a stacked-layer structure. These layers can be formed by any of a variety of deposition methods such as a sputtering method, a molecular beam epitaxy (MBE) method, a pulsed laser deposition (PLD) method, a CVD method, and an atomic layer deposition (ALD) method. Examples of a CVD method include a plasma CVD method, a thermal CVD method, and a metal organic CVD method.

The metal oxide layers 511 to 513 are collectively referred to as an oxide layer 510. As illustrated in FIG. 11A, the oxide layer 510 includes a portion where the metal oxide layer 511, the metal oxide layer 512, and the metal oxide layer 513 are stacked in that order. When the transistor 501 is on, a channel is mainly formed in the metal oxide layer 512 of the oxide layer 510.

A gate electrode of the transistor 501 is formed using the conductive layer 550. A pair of electrodes that functions as a source electrode and a drain electrode of the transistor 501 is formed using the conductive layers 551 and 552. A back gate electrode of the transistor 501 is formed using the conductive layer 553. The conductive layer 553 includes conductive layers 553a and 553b. Note that the transistor 501 does not necessarily include a back gate electrode. The same applies to OS transistors 502 to 507 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used.

For example, the conductive layer 550 is a single layer of tantalum nitride or tungsten. Alternatively, in the case where the conductive layer 550 has a two-layer structure or a three-layer structure, the following combinations can be used (the conductor written first is used for a layer on the insulating layer 527 side): aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 551 has a two-layer structure or a three-layer structure layer, the following combinations can be used (the conductor written first is used for a layer on the insulating layer 527 side): titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride.

For example, it is preferable that the conductive layer 553*a* be a conductive layer that has a hydrogen barrier property (e.g., a tantalum nitride layer) and that the conductive layer 553*b* be a conductive layer that has higher conductivity than the conductive layer 553*a* (e.g., a tungsten layer). With such a structure, the conductive layer 553 functions as a wiring and has a function of preventing diffusion of hydrogen into the oxide layer 510.

Examples of insulating materials used for the insulating layers 521 to 530 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 530 are formed using a single-layer structure or a stacked-layer structure of these insulating materials. The layers used for the insulating layers 521 to 530 may include a plurality of insulating materials.

Note that in this specification and the like, an oxynitride refers to a compound that contains more oxygen than nitrogen, and a nitride oxide refers to a compound that contains more nitrogen than oxygen.

In the transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the transistor 501 can be improved.

For example, the insulating layer 529 may function as a barrier layer and at least one of the insulating layers 521, 522, and 524 may function as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. A barrier layer may be provided between the oxide layer 510 and the conductive layer 550. Alternatively, a metal oxide layer that has oxygen and hydrogen barrier properties may be provided as the metal oxide layer 513.

The insulating layer 530 is preferably a barrier layer that prevents the conductive layer 550 from becoming oxidized. When the insulating layer 530 has a barrier property against oxygen, oxygen released from the insulating layer 528 or the like can be prevented from oxidizing the conductive layer 550. For example, the insulating layer 530 can be formed using a metal oxide such as aluminum oxide.

A structure example of the insulating layers 521 to 530 is described. In this example, each of the insulating layers 521, 522, 525, 529, and 530 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layers 529 and 530 are formed using aluminum oxide.

FIG. 11A illustrates an example in which the oxide layer 510 has a three-layer structure; however, one embodiment of the present invention is not limited thereto. For example, the oxide layer 510 may have a two-layer structure without the metal oxide layer 511 or 513, or may be composed of either one of the metal oxide layers 511 and 512. Alternatively, the oxide layer 510 may be composed of four or more metal oxide layers.

<<OS Transistor Structure Example 2>>

Figure 11B:
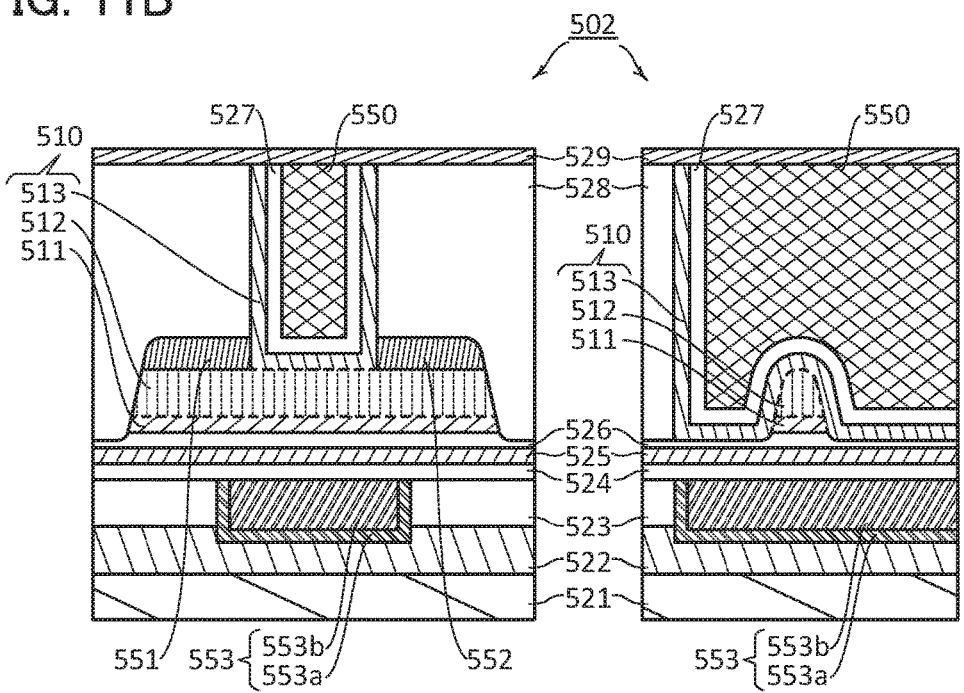

FIG. 11B illustrate a structural example of a transistor. The transistor 502 in FIG. 11B is a modification example of the transistor 501. The transistor 502 differs from the transistor 501 mainly in the structure of the gate electrode. A cross section of the transistor 502 in the channel length direction is illustrated on the left drawing of FIG. 11B, and a cross section of the transistor 501 in the channel width direction is illustrated on the right drawing of FIG. 11B.

The metal oxide layer 513, the insulating layer 527, and the conductive layer 550 are provided in an opening portion formed in the insulating layer 528. In other words, a gate electrode is formed in a self-aligned manner by using the opening portion of the insulating layer 528. Thus, in the transistor 502, a gate electrode (540) does not include a region that overlaps with a source electrode or a drain electrode (541 or 542) with a gate insulating layer (517) positioned therebetween. Accordingly, gate-source parasitic capacitance and gate-drain parasitic capacitance can be reduced and frequency characteristics can be improved. Furthermore, the gate electrode width can be controlled by the opening portion of the insulating layer 528; thus, it is easy to fabricate an OS transistor with a short channel length.

<<Structure Example of Semiconductor Device>>

A structure example of a semiconductor device including an OS transistor and a Si transistor is described with reference to FIG. 12.

FIG. 12 is a cross-sectional view illustrating the stacked-layer structure of the MCU 100 (FIG. 1). A main part of the DOSRAM 120 (specifically, a main part of the local array 235) mounted on the MCU 100 is illustrated in FIG. 12.

The MCU 100 includes stacked layers L10 to L14. The local sense amplifier array 245 is provided in the layers L10 and L11. The local memory cell array 240 is provided so as to overlap the local sense amplifier array 245 provided in the layers L12 to L14.

Si transistors included in the MCU 100 are provided in the layer L10. The layer L10 includes wirings, plugs, and the like. An active layer of the Si transistors are formed in a single-crystal silicon wafer 560. Transistors MS1 illustrated in FIG. 12 are transistors of the local sense amplifier array 245. The layer L11 includes wirings, plugs, and the like. In the stacked layers L10 and L11, a circuit configured with Si, such as the local sense amplifier array 245, is provided.

OS transistors, wirings (e.g., the word line), plugs, and the like are provided in the layer L12. The structure of the transistors MW1 illustrated in FIG. 12 is similar to the structure of the transistor 501 (FIG. 11A). The layer L13 is a capacitor layer in which a storage capacitor (the capacitor CS1) of the DOSRAM 120 is provided. A plug for electrically connecting the capacitor CS1 and transistor MW1 and the like are also provided in the layer L13. Wirings (e.g., the bit lines BLL and BLR and global bit lines GBLL and GBLR), plugs, and the like are provided in the layer L14.

Embodiment 4

In this embodiment, a cloud-aligned composite (CAC)-OS is described.

<<CAC-OS>>

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, the oxide semiconductor preferably contains indium and zinc. In addition, the oxide semiconductor preferably contains one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where is X1 a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern is evenly distributed in the film. This composition is also referred to as a cloud-like composition.

In the example above, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Here, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component and nanoparticle regions including In as a main component are observed in parts of the CAC-OS. Therefore, the crystal structure is a secondary element for the CAC-OS.

In this specification, a stacked-layer structure including two or more films with different atomic ratios is not included in the CAC-OS. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that a clear peak is not observed when measurement is conducted using a $\theta/2\theta$ scan by an out-of-plane method with an X-ray diffraction (XRD). That is, X-ray diffraction shows no alignment in the a-b plane direction and the c-axis direction in a measured region.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including GaOX3 or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

Furthermore, a semiconductor element including a CAC-OS has high reliability. Thus, CAC-OS is suitable for use in various semiconductor devices, such as a memory device, an imaging device, and a display device.

This application is based on Japanese Patent Application serial No. 2016-116448 filed with Japan Patent Office on Jun. 10, 2016, the entire contents of which are hereby incorporated by reference.

What is claimed is:

1. A memory device configured with a burst read mode, comprising:
   a global sense amplifier array;
   first to $M_0$th local memory cell arrays; and
   first to $M_0$th local sense amplifier arrays,
   wherein $M_0$ is an integer greater than or equal to 2,
   wherein a Jth local memory cell array is stacked over a Jth local sense amplifier array,
   wherein the Jth local memory cell array comprises first to $M_0$th blocks differentiated by row,
   wherein the first to $M_0$th blocks each comprise a plurality of memory cells,
   wherein the memory cells each comprise a capacitor and a transistor,
   wherein the Jth local sense amplifier array in an idle state retains data of a Jth block,
   wherein the Jth block is specified when the Jth local memory cell array is the first local memory cell array that is accessed in the burst read mode, and
   wherein J is an integer from 1 to $M_0$.

2. The memory device according to claim 1,
   wherein one block in each of the first to $M_0$th local memory cell arrays is accessed during the burst read mode.

3. The memory device according to claim 1,
   wherein first to $M_0$th blocks are accessed during the burst read mode when a $J_x$th local array comprising the Jth local memory cell array and the Jth local sense amplifier array is specified by an external address signal ADDR, and
   wherein 4 is an integer from 1 to $M_0$.

4. The memory device according to claim 1,
   wherein the transistor comprises a metal oxide in a channel formation region.

5. A semiconductor device comprising:
   a processor core;
   a memory portion; and
   a bus,
   wherein the memory portion comprises the memory device according to claim 1, and
   wherein the transfer of a signal and data between the processor core and the memory portion is performed through the bus.

6. The semiconductor device according to claim 5,
   wherein the memory portion comprises at least one of an SRAM, a flash memory, a ferroelectric RAM, a magnetoresistive RAM, a resistive RAM, and a phase-change RAM.

7. An electronic component comprising:
   a chip; and
   a lead,
   wherein the lead is electrically connected to the chip, and
   wherein the memory device in claim 1 or the semiconductor device in claim 5 is provided on the chip.

8. An electronic device comprising:
   the electronic component according to claim 7; and
   at least one of a display portion, a touch sensor, a microphone, a speaker, an operation key, and a housing.

9. A memory device configured with a burst read mode with a burst length of $M_0 \times M_1$ wherein $M_0$ is an integer greater than or equal to 2, and $M_1$ is an integer greater than or equal to 1, comprising:

a global sense amplifier array;
first to $(M_0 \times M_1)$th local memory cell arrays; and
first to $(M_0 \times M_1)$th local sense amplifier arrays,
wherein a Jth local memory cell array is stacked over a Jth local sense amplifier array,
wherein the Jth local memory cell array comprises first to $M_0$th blocks differentiated by row,
wherein the first to $M_0$th blocks each comprise a plurality of memory cells,
wherein the memory cells each comprise a capacitor and a transistor,
wherein the Jth local sense amplifier array in an idle state retains data of a $X_1$th block,
wherein the $X_1$th block is specified when the Jth local memory cell array is the first local memory cell array to be accessed in the burst read mode, and
wherein J is an integer from 1 to $M_0 \times M_1$ and $X_1$ is an integer from 1 to $M_0$.

10. The memory device according to claim 9,
wherein one block in each of the first to $(M_0 \times M_1)$th local memory cell arrays is accessed during the burst read mode.

11. The memory device according to claim 9,
wherein the transistor comprises a metal oxide in a channel formation region.

12. A semiconductor device comprising:
a processor core;
a memory portion; and
a bus,
wherein the memory portion comprises the memory device according to claim 9, and
wherein the transfer of a signal and data between the processor core and the memory portion is performed through the bus.

13. The semiconductor device according to claim 12,
wherein the memory portion comprises at least one of an SRAM, a flash memory, a ferroelectric RAM, a magnetoresistive RAM, a resistive RAM, and a phase-change RAM.

14. An electronic component comprising:
a chip; and
a lead,
wherein the lead is electrically connected to the chip, and
wherein the memory device in claim 9 or the semiconductor device in claim 12 is provided on the chip.

15. An electronic device comprising:
the electronic component according to claim 14; and
at least one of a display portion, a touch sensor, a microphone, a speaker, an operation key, and a housing.

* * * * *